(12) United States Patent
Dabiri

(10) Patent No.: US 8,989,283 B1
(45) Date of Patent: Mar. 24, 2015

(54) HIGH SPEED TRANSCEIVER BASED ON CONCATENATES OF A LEECH LATTICE WITH BINARY AND NONBINARY CODES

(71) Applicant: Applied Micro Circuits Corporation, Sunnyvale, CA (US)

(72) Inventor: Dariush Dabiri, San Jose, CA (US)

(73) Assignee: Applied Micro Circuits Corporation, Sunnyvale, CA (US)

( * ) Notice: Subject to any disclaimer, the term of this patent is extended or adjusted under 35 U.S.C. 154(b) by 0 days.

(21) Appl. No.: 14/466,347

(22) Filed: Aug. 22, 2014

Related U.S. Application Data

(60) Provisional application No. 61/869,395, filed on Aug. 23, 2013.

(51) Int. Cl.
*H04B 3/00* (2006.01)
*H04L 25/00* (2006.01)
*H04L 27/00* (2006.01)
*H04L 1/00* (2006.01)
*H03M 13/39* (2006.01)

(52) U.S. Cl.
CPC .......... *H04L 27/0002* (2013.01); *H04L 1/0061* (2013.01); *H04L 1/0067* (2013.01); *H03M 13/3916* (2013.01)
USPC .......................... 375/257; 714/751; 714/752

(58) Field of Classification Search
CPC ............ H03M 13/1505; H03M 13/25; H03M 13/251; H03M 13/256; H03M 13/3916; H03M 13/3944; H04L 1/0057; H04L 1/006; H04L 27/3477
USPC .................................. 375/257; 714/751–758
See application file for complete search history.

(56) References Cited

U.S. PATENT DOCUMENTS 4,933,956 A * 6/1990 Forney, Jr. .................... 375/341

* cited by examiner

*Primary Examiner* — Curtis Odom
(74) *Attorney, Agent, or Firm* — Amin, Turocy & Watson, LLP

(57) ABSTRACT

A transceiver architecture can contain an encoder and a decoder for communicating high speed transmissions. The encoder can modulate signal data for being mapped in a constellation that is generated based on concatenations of a leech lattice having binary and non-binary codes. The data can be transmitted at a high speed according to the constellation with an embedded leech lattice configuration in order to generate a coding gain. A decoder operates to decode the received input signal data with a decreased latency or a minimal latency with a high spectral efficiency.

20 Claims, 12 Drawing Sheets

HIGH SPEED TRANSCEIVER BASED ON CONCATENATES OF A LEECH LATTICE WITH BINARY AND NONBINARY CODES

CROSS-REFERENCE TO RELATED APPLICATION(S)

The subject application for patent claims priority to U.S. Provisional Patent Application No. 61/869,395 entitled "TRANSMISSION OVER REDUCED PAIRS OF TWINAX CABLES AND COMMUNICATION CODING" filed Aug. 23, 2013, which is incorporated by reference herein in its entirety and for all purposes.

TECHNICAL FIELD

The subject disclosure relates generally to transceiver communications and more particularly to communications at a high speed based on concatenates of a leech lattice constellations with binary and non-binary codes.

BACKGROUND

Cables are often utilized as physical media to connect devices that may be networked. Signals can be sent over a physical layer of wires, for example, in which signal coding can used for enhancing the transmission. The cable can include a data link layer for messages sent between a controller (master) and a slave device. The messages could have a set of normal bits for bit synchronization, followed by a frame sync pattern, for example. The frame sync pattern, for example, can be followed by data bit frames, in which each frame could include a start bit, a bit data field, a parity bit and/or a set of fill bits of zero.

For applications requiring a high data rate with low latency performance, such as in Storage Area Networks and High Performance Computing, the interconnect media selected should have a very high bandwidth capacity, such as with twin axial (twinax) cable, to support the un-modulated baseband signal. To obtain low latency while having low power dissipation, baseband digital communication is typically used instead of a complex modulation scheme requiring sophisticated coding techniques. A drawback is media analog bandwidth. For example, in order to support 10 Gbps (Gigabit/sec) data communication, the media support a certain frequency Hertz of analog bandwidth. In order to achieve these bandwidths, the cable design and coding is refined to address performance parameters in this frequency range.

The above-described description is merely intended to provide a contextual overview of current cable interconnects and is not intended to be exhaustive. Other problems with conventional systems and corresponding benefits of the various non-limiting embodiments described herein may become further apparent upon review of the following description.

SUMMARY

The following presents a simplified summary in order to provide a basic understanding of some aspects described herein. This summary is not an extensive overview of the disclosed subject matter. It is intended to neither identify key nor critical elements of the disclosure nor delineate the scope thereof. Its sole purpose is to present some concepts in a simplified form as a prelude to the more detailed description that is presented later.

Various embodiments for transmission coding with a transceiver device are disclosed herein. An exemplary system comprises a transceiver device configured for communicating a set of signals via a communication link, and comprising a memory storing executable instructions, and a processor, communicatively coupled to the memory, that facilitates execution of the executable instructions to perform operations. The operations can include generating a constellation of modulated points from a set of signals received. The operations can also include generating a leech lattice within the constellation of modulated points by mapping dimensions of the leech lattice to the modulated points, the leech lattice comprising a concatenation of codes.

In another embodiment, a transceiver device comprises a memory to store computer-executable instructions, and a processor, coupled to the memory, that facilitates execution of the computer-executable instructions to perform operations. The operations can include generating a constellation of modulated points. The operations can also generating a leech lattice of the modulated points in the constellation by mapping a concatenation of codes to dimensions of the leech lattice.

In another embodiment, a signal processing method comprises generating, by a device with a processor, a constellation of modulated points from a set of signals received. The dimensions of a leech lattice are mapped to the modulated points to generate the leech lattice with the modulated points in the constellation based on a concatenation of binary or non-binary codes.

The following description and the annexed drawings set forth in detail certain illustrative aspects of the subject disclosure. These aspects are indicative, however, of but a few of the various ways in which the principles of various disclosed aspects can be employed and the disclosure is intended to include all such aspects and their equivalents. Other advantages and novel features will become apparent from the following detailed description when considered in conjunction with the drawings.

BRIEF DESCRIPTION OF THE DRAWINGS

Non-limiting and non-exhaustive embodiments of the subject disclosure are described with reference to the following figures, wherein like reference numerals refer to like parts throughout the various views unless otherwise specified.

DETAILED DESCRIPTION

Figure 1:
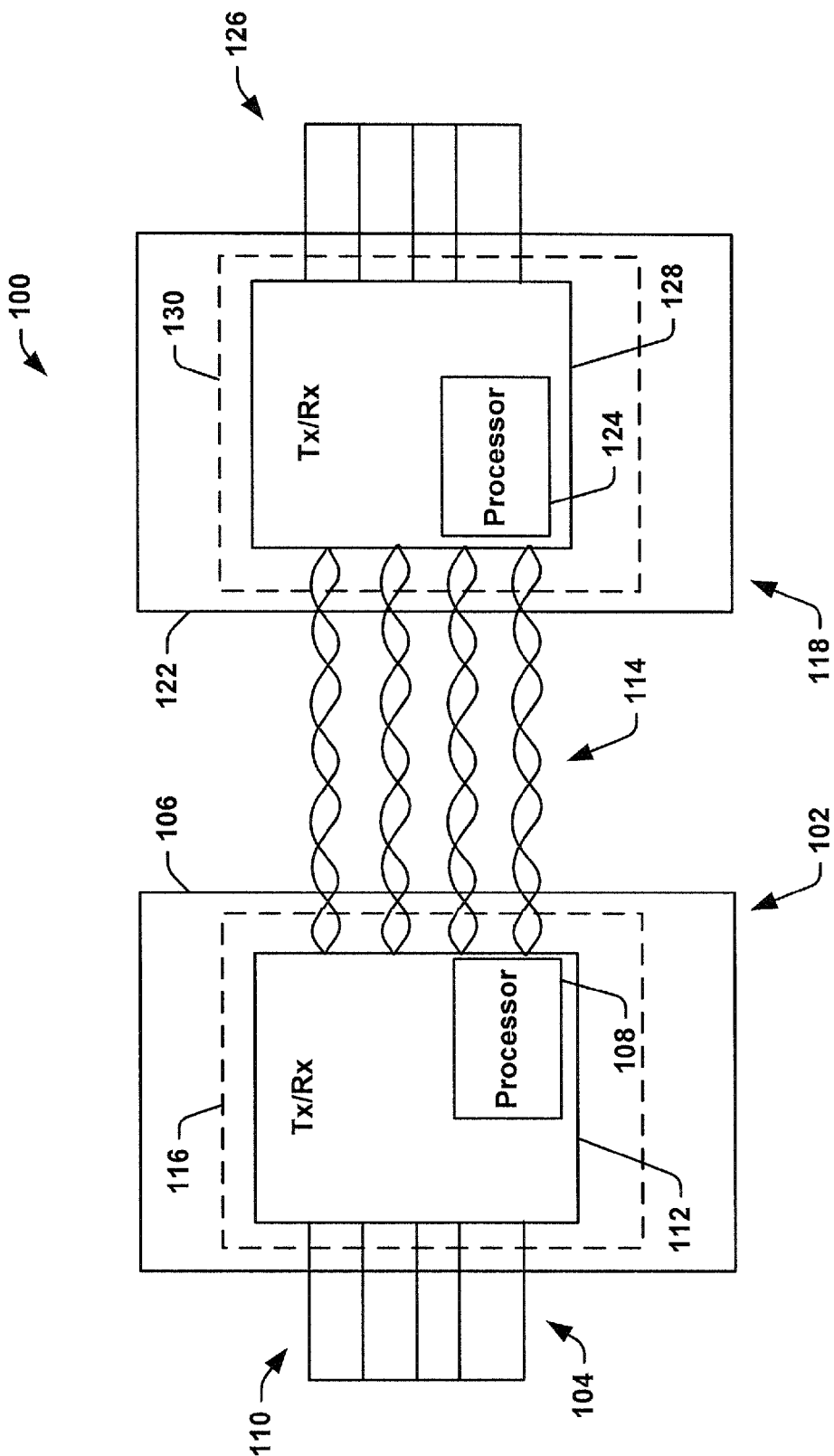
FIG. 1 is a block diagram illustrating an example of a cable assembly system in accordance with various aspects described herein.

The disclosure herein is described with reference to the drawings, wherein like reference numerals are used to refer to like elements throughout. In the following description, for purposes of explanation, numerous specific details are set forth in order to provide a thorough understanding of the subject innovation. It may be evident, however, that various disclosed aspects can be practiced without these specific details. In other instances, well-known structures and devices are shown in block diagram form in order to facilitate describing the subject innovation.

In consideration of the above-described trends or deficiencies among other things, various embodiments are provided for transceiver architectures that employ constellation designs based on a concatenated leech lattice with binary and non-binary codes for coded communications where significant coding gain can be achieved with a low latency decoder and a high spectral efficiency. For example, by encoding with leech lattices, high speed transmission rates can be achieved with no increases in latency or a lower latency, such as with 100 Gbps transmission rates or greater for full-duplex communications over one or more communication links, such as optical communication links or a reduced number of twinaxial (twinax) pairs. For example, a cable assembly can include a set of twinaxial (or "twinax") cables that can each comprise a full-duplex or half-duplex twinax pair of conductors, optical communication links, and/or fiber optic links. The cable assembly can be configured for communicating one or more signals in two directions simultaneously at transmission speeds of 100 Gigabytes per second or greater by utilizing concatenated leech lattices for modulation over communication links, such as processing or transmitting communications at speeds greater than 150 Gigabytes per second or greater than 200 Gigabytes per second.

Coded lattice modulation processes described herein can be based on leech lattices, for example. A lattice can comprise a set of points in an n-dimensional real space, in which the coordinates of each point can be derived by one or more linear combinations of a predefined set of vectors. The coefficients of the one or more linear combinations can comprise integer numbers. Leech lattices can be an even unimodular lattice $\Lambda_{24}$ in 24-dimensional Euclidean space $E^{24}$. A leech lattice can comprise various characteristics and properties. For example, a leech lattice can be unimodular, and thus, can be generated by the columns of a certain 24×24 matrix with a determinant of one. The leech lattice can be even, or, in other words, the square of the length of any vector in $\Lambda_{24}$ can be an even integer. In addition, the length of any non-zero vector in $\Lambda_{24}$ is at least 2.

The last condition is equivalent to the condition that unit balls centered at the points of $\Lambda_{24}$ do not overlap. Each is tangent to 196,560 neighbors, and this is the largest number of non-overlapping 24-dimensional unit balls that can simultaneously touch a single unit ball. This arrangement of 196560 unit balls centered about another unit ball is so efficient that there is no room to move any of the balls; this configuration, together with its mirror-image, is the only 24-dimensional arrangement where 196560 unit balls simultaneously touch another. This property is also true in 1, 2 and 8 dimensions, with 2, 6 and 240 unit balls, respectively, based on the integer lattice, hexagonal tiling and E8 lattices, respectively.

The leech lattice does not comprise a root system and in fact is the first unimodular lattice with no roots (vectors of norm less than 4), and therefore has a center density of 1. By multiplying this value by the volume of a unit ball in 24 dimensions, $$\frac{\pi^{12}}{12!}$$

one can derive the absolute density.

The constellation designs that are described can comprise translations or constructions of a basic constellations based on leech lattices embedded within the constellations that are concatenated with binary and/or non-binary codes. In one embodiment, a communication system with a processor can operate to decode a code, which is known as a hexacode ($H_6$). The hexacode is a code that is defined over an alphabet of two bits, for example. The symbols of the code can have four different values, which can be from a field denoted as {0, 1, omega, omega vector). If examining the multiple points being transported along a defined time are analyzed and the bits are analyzed that are encoded into the Hexacode with a variable FEC with the bits encoded by the hexacode, a larger coding gain can be obtained when re-encoding and decoding the receive points knowing the value of the Hexacode used in the reconstruction of the transmission. A transmission of approximately three bits per Hertz (bits/Hz) can be achieved using a lattice constellation with binary and/or non-binary codes.

Referring now to FIG. 1, illustrated is an embodiment of a cable assembly 100 that can embody one or more coding modulation schemes based on constellations (e.g., constellation diagrams) embedded with or having a concatenated leech lattice with binary and non-binary codes described herein. The cable assembly can comprise, for example, a first end device 106 and a second end device 122 for an interconnection of one or more devices (not shown), such as a computer device, mobile processing device, display device personal digital assistant, etc. The cable assembly 100 can operates as an active twinax cable device for high speed, full-duplex or half-duplex transmissions among devices or device processors with a reduced set of twinax conductor pairs for modulating communications based on constellation designs for an increase in coding gain and high spectral efficiency. Additionally, the cable assembly 100 can operate to simultaneously transmit and receive data at a transmission speed of 100 Gbps or greater for one or more different communication protocols via a communication link such as via wired and/or optical link communications to maintain or decrease latency in encoding and decoding processes.

For example, the cable assembly 100 can comprise an interface 110 and an interface 126 at each end that can include a set of interconnects 104, 120 (e.g., copper interconnects or optical links) that can operate to interface with a receiving port or a plug such as a Quad Small Form-factor Pluggable (QSFP), a Small Form-factor Pluggable, or other pluggable connector. The interface 110 and 126 can be operatively connected to a circuit board 116 and 130 or a surface mount or processor package mount (e.g., a ball grid array or the like) having a processor 108 and 124. The interface 110 and 226 can also include a plug portion (not shown) of the cable assembly 100, which operates as a mate for connection to a plug or port of a device or processing device for communication between one or more other devices. The cable assembly 100 can be operable as an active cable device that draws or consumes power at one or more ends of the assembly 100, and further processes, encodes and decodes transmissions of one or more communications based on a concatenated leech lattice with low bit error rates and high efficiency.

The cable assembly 100 can comprise a plug assembly 102 and 118 at an end of the cable assembly 100 that comprises the plug portion or the interface 110 that operates as the mate for connection to a plug or port of a device. The plug assembly 102 or 118 can comprise a processor 108 or 124 operatively connected to the circuit board 116, 130 or a surface mount respectively. The processor 108 or 124 can operate with a transceiver 112, 128 to encode, decode, partition, or process error correction code (ECC) such as Forward Error Correction Code (FEC) according to one or more algorithms that can enable high speed, full-duplex transmissions of data at 100 Gbps or greater Gbps via the twinax pairs 114 based on leech lattice constellations.

The processors 108 or 124 can operate to draw or consume power from an independent power source (not shown) located internally, which can be coupled to the circuit board or processor package 116, 130. In addition or alternatively, the signals being transmitted can be used to power the communication link or cable. For example, a power signal transmission can be utilized to power the processors 108 or 124 for transmission, such as by an electromagnetic coupling or other remote power signals. A power source from the device coupled to the cable assembly can also be utilized to power the processors 108, 124, such as from an external power source located on the device. Alternatively, the cable assembly 100 can operate as a passive device without a power source or drawing power from one or more connected devices.

The processors 108 and 24 can be further integrated as transceiver processors that operate to communicate (transmit and/or receive) signals for full-duplex transmissions along the twinax pairs. In addition or alternatively, the processors 108 and 124 can be coupled to a transmitter, receiver, or transceiver 112, 128 located within the plug assembly 102, 118. For example, a transceiver 112, or 128 can be coupled to the processors on the circuit board 116 or 130 via routed traces or a processor package having connect pads, ball grid array, or other like interconnects mounted on the circuit board 116, 130 (e.g., a printed circuit board) of the cable assembly 100.

In one embodiment, high-speed transmission architecture of the cable assembly 100 can be based on a concatenated leech lattice embedded in the constellation with binary and/or non-binary codes. For example, a transceiver architecture having the transceiver 112 and/or 128 can employ a constellation design where significant coding gain is achieved with low latency decoding processes and high spectral efficiency. This embodiment can be applied where coding gain is desired at high speed applications where because of bandwidth limitations there is a need for high spectral efficiency and at the same time the latency of the decoding processes can be minimized. This high spectral efficiency increases the number of bits per bandwidth while maintaining requirements for a set of links, channels or twinax pairs 114, for example.

A lattice, for example, can comprise a set of the points in an n-dimensional real space, where the coordinates of each point are derived by one or more linear combinations of a pre-defined set of vectors where all the coefficients of the linear combination can comprise integer numbers. A leech lattice can operate to achieve a maximum spatial density in twenty-four dimensions. The current methods that rely on simple constellations such as PAM-n, do not achieve coding gain from the constellation. Rather, coding gain is achieved by using long algebraic codes such as Reed-Solomon (RS) codes. These long algebraic codes suffer from a long latency. In addition, trellis coded modulation codes or TCM codes are not always suitable for high speed implementations, since reducing the latency for such decoders can result in a rapid increase in their complexity.

In an aspect, the transceiver system architecture of the cable assembly 100 can comprise transceivers 112, 128 that are configured to generate coding modulations with a constellation design having translations of a basic constellation based on concatenated leech lattices with binary and/or non-binary codes. This construction of the constellation can comprise multiple steps.

For example, a twenty-four dimensional array of modulated symbols (e.g., PAM-4 symbols) can be analyzed within those steps for encoding/decoding communication signals over the pairs or the optical communication links 114. The constellation diagram can comprise modulation points (e.g., pulse-amplitude modulation (PAM) points) or symbols where communicated data, a set of signals, or, in other words, message information is encoded in the amplitude of a series of signal pulses. In an analog pulse modulation processes or scheme the amplitudes of a train of carrier pulses can be varied according to the sample value of the message signal. For example, the transceiver 112, 128 can include a two-bit modulator (PAM-4) (not shown) that can operate to process two bits at a time and map the signal amplitude to one of four possible levels, for example −3 volts, −1 volt, 1 volt, and 3 volts. Demodulation can be performed by detecting the amplitude level of the carrier at every symbol period, for example. The transceiver 112, 128 can operate to generate a twenty-four dimensional array of PAM-4 symbols, which can then be analyzed for further coding.

In another embodiment, the leech lattice can be concatenated with binary and non-binary codes. The transceivers 112, 128 can operate to generate FEC encoding for mapping operations, such as generate at a mapping component further discussed infra. The mapping operations can utilize an FEC code rate output that can include a rate of one-half. The rate of the FEC coding (e.g., 32/64 for one below example) can be one-half, which is the sum of the information symbol bits (e.g., 32) divided by the length of the code (e.g., 64). The transceivers 112, 128 can then output twenty-four symbols, for example, based on a concatenated leech lattice of the constellation or constellation diagram.

On the transmit side, when encoding bits to a Leech lattice multiple steps are taken to define the points (modulated points) selected, which defines a partition of the points in a 24 dimensional space. Alternatively, the space can be a twelve two dimensional space, or twelve two dimensional partitions. The transceivers 112, 128 of the system can further operate to decode a code which is known as a hexacode ($H_6$). The hexacode is a code that is defined over an alphabet of two bits. The symbol can have four different values, which can be from a field denoted, for example, as {0, 1, omega, omega vector}.

If examining the multiple points being transported along a defined time and the coded bits are analyzed that are encoded into the hexacode with a variable FEC with the bits encoded by the hexacode, a larger coding gain can be obtained when re-encoding and decoding the receive points knowing the value of the hexacode used in the reconstruction of the transmission. A transmission of approximately three bits per Hertz (bits/Hz) can be achieved using a concatenated lattice constellation with binary and non-binary codes. An FEC encoder, for example, can add FEC code on top of the transmission that can thus allow extra protection to certain bits that enables an efficient decoding of the receive points.

In one example, the hexacode can be denoted as (6, 3, 4), in which the number of bits comprise six bits in length, the number of the information symbols is three, and the minimum Hamming distance of the codes is equal to four. Because the number of information symbols is three, for example, and the symbols comprise two bits each, then six bits can uniquely specify the encode rules in the hexacode. In other words, the hexacode can comprise sixty-four code words.

In one aspect of the embodiment, a speed of three bits per Hertz is achieved through the twenty-four dimensions of the Leech Lattice, which results in 24 symbols that will be transmitted from a mapper or a mapping component, for example, which is further discussed infra. The three bits per Hertz computes to three times a product of a dimensional space (e.g., 24) for a number of bits to be transmitted (e.g., 72) with 12 bits that can be transmitted. The rate of the transmission can be determined, for example, by examining sixteen layer constellations or a path 16 constellation of the code.

Figure 2:
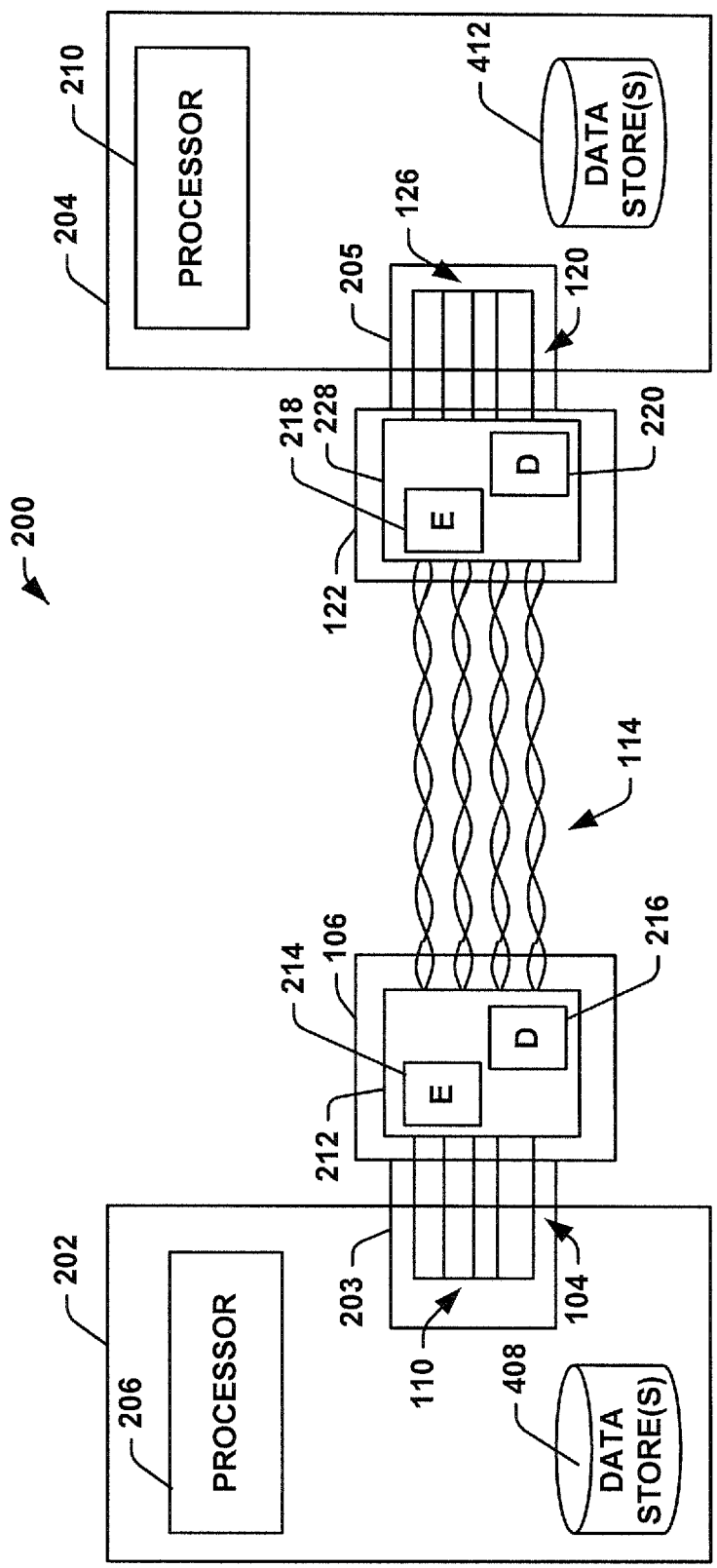
FIG. 2 is a block diagram illustrating another example of a cable assembly system with transceiver architecture in accordance with various aspects described herein.

Referring now to FIG. 2, illustrated is an example of a cable assembly 200 that operates at high speed transmission for transmitting and receiving data back and forth from one or more devices by utilizing a concatenated leech lattice configured within constellations with binary and/or non-binary codes. The cable assembly 200 comprises similar components as discussed above and further includes encoding components and decoding components mounted on a surface mount or circuit board 106 and 122, for example, within plug assemblies, which can encode and decode communication data or signals based on a concatenated leech lattice constellation.

The cable assembly 200 can be operatively coupled to a first device 202 and a second device 204 via a plug 203 and a plug 205, which can comprise a receiving port, for example, which can be a Quad Small Form-factor Pluggable (QSFP), a Small Form-Factor Pluggable (SFP) port, a Small Form Factor SFF casing, or other receiving port configured for wired and/or optical links. The first device 202 or the second device 204 can respectively comprise a processor 206, 210 and one or more data stores 208 and 212. The first device 202 or the second device 204 can comprise a processing device such as a personal computer device, a mobile device, an input/output device, a display, a personal digital assistant, or other similar device operable for communicating via the plug 203 or 205.

A surface mount or electronic board 106 and 122 of plug assemblies at opposite ends of the twinax pairs 214 can comprise transmitters 212 and 228, which can include encoders 214 and 218 and decoders 216 and 220 respectively that are operatively coupled to a processor and/or transceiver architectures on circuit boards or respective mounting assemblies. The encoders 214 and 218, for example, can operate to encode at least a part of information of signals from one format, code or communication protocol to another via one or more algorithms based on a leech lattice constellation. The decoder 216 or 220 can operate to reverse the operation of the encoder in order to convert the information from one format or protocol into another format or protocol. For example, the decoder 216 or 220 can operate to convert binary/non-binary information from a number of lines to a unique output line or lines. For example, in cases where one or more encoders encode data from the first device 202 into one format for high speed transmission, the decoder 220 can operate to decode and/or re-code the data based on the second device 204 being a different device operating in a different communication protocol according to concatenated leech lattices of constellations.

Another embodiment of the transceiver architectures 212 and 228 can employ constellation processes as described above. The encoder 214 or 218 can operate to map a constellation diagram as representation of a signal modulated by a digital modulation scheme such as a pulse amplitude modulation, quadrature amplitude modulation, phase-shift keying, etc., for example. The constellation diagram can be a diagram or other representation of a set of signals to be transmitted as a dimensional scatter diagram in the complex plane at symbol sampling instants. For example, a twenty four dimension vector of pulse amplitude modulation points can be mapped to lie on a concatenated leech lattice. In a more abstract sense, the constellation/constellation diagram can represent the possible symbols that may be selected by a given modulation scheme as points in a complex plane. Further, the encoders 214 and 218 can be utilized to determine measurements of constellation diagrams to recognize the type of interference and distortion in a signal by the transmitters 212 and 228. By representing a transmitted symbol as a complex number and modulating a cosine and sine carrier signal with the real and imaginary parts (respectively), the symbol can be sent with two carriers on the same frequency, for example, such as quadrature carriers. The use of two independently modulated carriers is the basis of quadrature modulation. In addition, phase modulation can be utilized where the phase of the modulating symbol is the phase of the carrier itself, as well as pulse amplitude modulation where the signals are encoded in the amplitude of a series of signal pulses.

As the symbols are represented as complex numbers, they can be visualized as points on the complex plane. The real and imaginary axes can be the in phase, or I-axis, and the quadrature, or Q-axis, respectively. Plotting or mapping several symbols in a scatter diagram produces the constellation or diagram. The points on a constellation diagram are called constellation points (points). They are a set of modulation symbols which comprise the modulation alphabet.

The encoders 214 and 218 can operate to map constellations based on leech lattices with a twenty four dimensional array of symbols (e.g., PAM-4 symbols), and further operate to pre-code the symbols such as by Tomlinson-Harashima pre-coding, such as to pre-cancel known interference without a power penalty, for example. The encoders 214 and 218 can operate to linearly filter the pre-coded signals by processing the signals as time-varying input signals to produce output signals subject to a constraint of linearly. The linearly filtered signals could then be used for purposes of channel equalization as well as other optimization techniques, for example. In addition, the output of the linear filtering can be used to drive a digital to analog conversion process or line driver operations.

The decoders 216 and 220 can operate to receive the encoded signal on an analog front end and process the signals with a programmable gain and an analog to digital conversion process. The receive pathway of the decoders 216 and 220 can include a phase locked loop, for example, that generates an output whose phase is related to the phase of the input signal or for the purposes of a clock recovery process. The receive pathway of the decoders 216 and 220 can be a digital receive path that provides linear equalization processes and detector algorithms to reduce the bit error rate in detecting the constellation points based on the leech lattice transmitted. The decoders 216 and 220 can operate to provide a phase detection of the transmitted signals for detecting timing differentials between a received signal and a detected signal to drive a clock recovery loop. The output can then be applied to forward error correction decoding processes for controlling errors in data transmission.

The concatenated leech lattice, for example, can be formed from codes that are derived by combining an inner code and an outer code with binary and/or non-binary codes. For example, let $C_{in}$ be a [n, k, d] code, that is, a block code of length n, dimension k, minimum Hamming distance d, and rate r=k/n, over an alphabet A. For example, if $C_{in}$ is decoded using a maximum-likelihood approach (thus showing an exponentially decreasing error probability with increasing length), and $C_{out}$ is a code with length $N=2^{nr}$ that can be decoded in polynomial time of N, then the concatenated code can be decoded in polynomial time of its combined length $n2^{nr}=O(N \cdot \log(N))$ and shows an exponentially decreasing error probability, even if $C_{in}$ has exponential decoding complexity.

Figure 3:
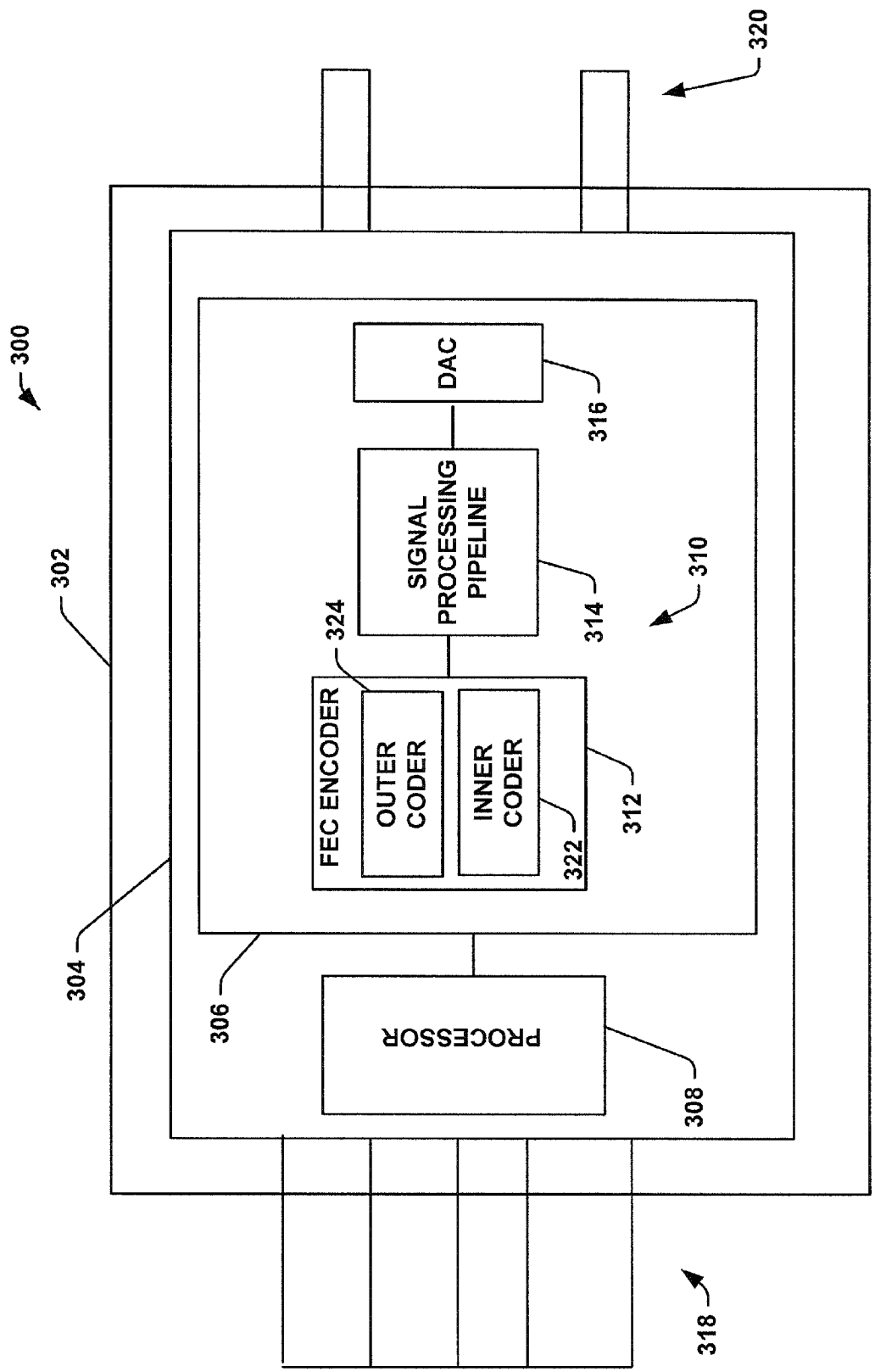
FIG. 3 is a block diagram illustrating another example of cable assembly system with a transmit path of transceiver architecture in accordance with various aspects described herein.

Referring now to FIG. 3, illustrated is a cable assembly 300 having a transceiver architecture for transmission of encoded data at high transmission speeds (e.g., 80 Gbps or 100 Gbps and greater) along a transmit path. The cable assembly 300 can comprise a plug assembly 302 with a surface mount, circuit board, or signal processing device 304 that includes a transceiver device 306 for encoding and decoding communications based on constellations mapped according to concatenated leech lattices, for example. The processing device 304 comprises a processor 308 that can have one or more internal memories for communication modulation and processing. The transceiver device 306 comprises a transmit path 310 that operates to transmit signals via one or more twinax or optic fibers 320 at speeds of at least 100 Gbps based on constellations generated with a leech lattice that achieves a density of twenty four dimensions.

The transmit path 310 of the transceiver device 306 can comprise an FEC encoder 312, a transmit signal processing pipeline 314 and a digital-to-analog converter (DAC) 316. The transceiver device 306 can receive one or more signals for modulation and transmission via an interconnect 318 that can comprise copper, optical and/or wireless interconnections for receiving signals from another device. On the transmit path 310, the cable assembly 300 can include the FEC encoder 312 that can operate to encoded data received and to transmit most significant bits (msbs) to the transmit signal processing pipeline 314, which can include one or more processing components for processing signals concurrently or at the same time. The FEC encoder 312 or the signal processing pipeline 314, for example, can receive signals over a set of bit stream pathways (e.g., three connections) and encode or assimilate the signals via mapping operations to output a set of symbols for transmission across the channel (e.g., the twinax pairs 320). The DAC 316 can operate to convert the digital signal to an analog signal for transmission.

The signal processing pipeline 314 can operate to filter the output of the FEC encoder 312 with a linear constraint and perform channel equalization as well as other optimization operations. The output of the linear filtering processes can further drive the DAC 316 or a line driver (not shown), for example.

In an embodiment, the encoder 312 can operate with the signal processing pipeline 314 to generate a coding gain by embedding or configuring a concatenated leech lattice within a constellation or constellation diagram used for encoding and processing in the transmission signal processing pipeline 314. The transmit path 310 can generate the constellation design with translations of constellations based on leech lattices. For example, the FEC encoder 312 can encode forward error correction code and signal points with a twenty four dimensional array of symbols (e.g., PAM-4 symbols). The encoder 312 can generate and apply a restriction of twenty four dimensional vectors on the modulated points to lie or overlay on a leech lattice, and thus, generate constellations with a concatenated leech lattice embedded within the constellation of encoded signals.

The FEC encoder 312 can comprise an inner coder 322 and an outer coder 324. The inner coder 322 and outer inner coder 324 can operate to enable generation of a concatenated leech lattice from codes that are derived by combining an inner code and an outer code with binary and/or non-binary codes. For example, as discussed above, letting $C_{in}$ be a [n, k, d] code, that is, a block code of length n, dimension k, minimum Hamming distance d, and rate r=k/n, over an alphabet A: $C_{in}:A^k \rightarrow A^n$.

Letting $C_{out}$ be a [N, K, D] code over an alphabet B with $|B|=|A|^k$ symbols: $C_{out}:B^K \rightarrow B^N$. The inner code $C_{in}$ takes one of $|A|^k=|B|$ possible inputs, encodes into an n-tuple over A, transmits, and decodes into one of $|B|$ possible outputs. A channel can thus transmit one symbol from the alphabet B. This channel can be used N times to transmit each of the N symbols in a codeword of $C_{out}$. The concatenation of $C_{out}$ (as outer code) with $C_{in}$ (as inner code), denoted $C_{out} \circ C_{in}$, is thus a code of length Nn over the alphabet A: $C_{out} \circ C_{in}:A^{kK} \rightarrow A^{nN}$. This maps each input message $m=(m_1, m_2, \ldots, m_k)$ to a codeword $(C_{in}(m'_1), C_{in}(m'_2), \ldots, C_{in}(m'_N))$, where $(m'_1, m'_2, \ldots, m'_N)=C_{out}(m_1, m_2, \ldots, m_K)$.

Figure 4:
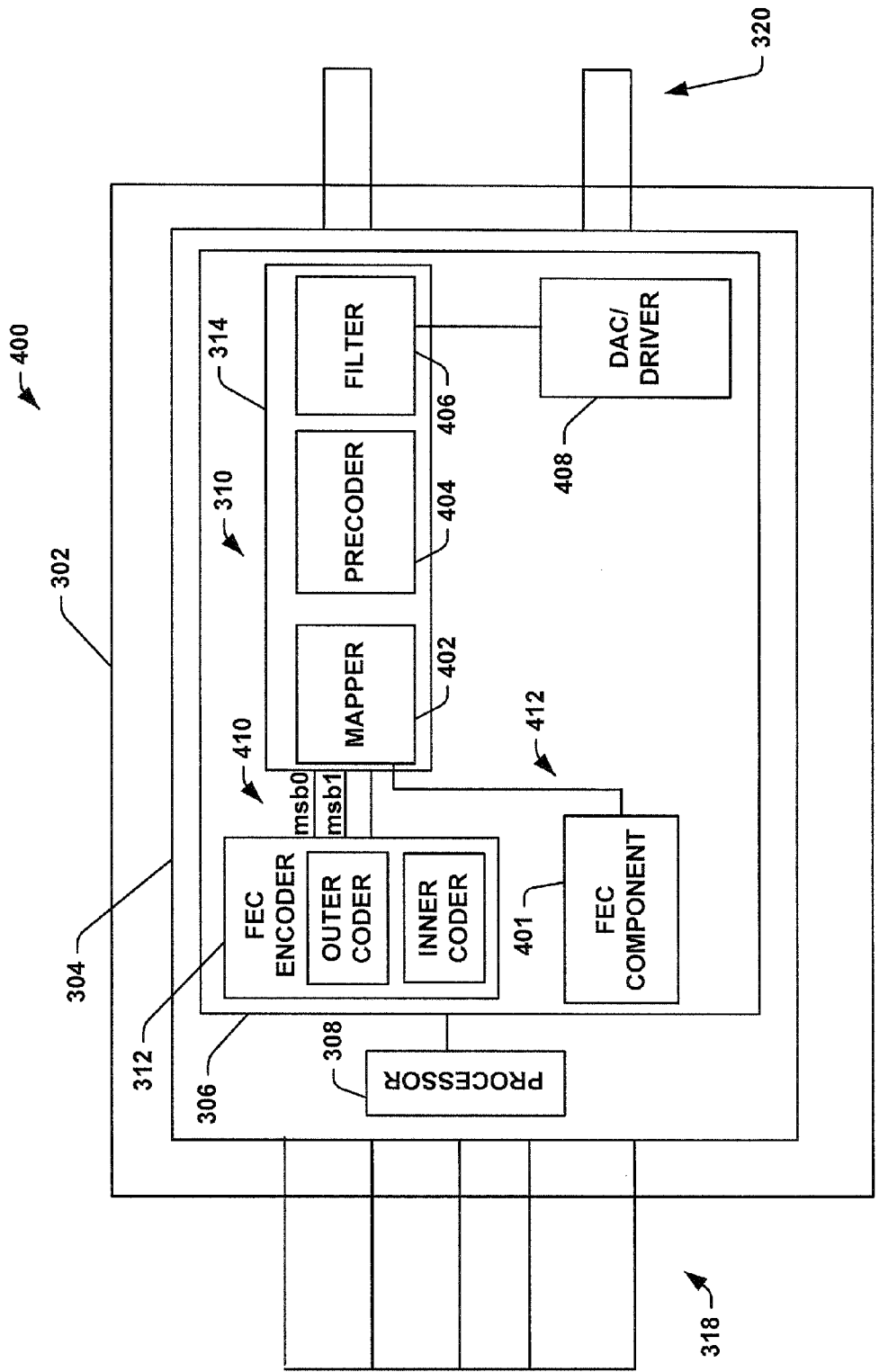
FIG. 4 is a block diagram illustrating another example of cable assembly system with a transmit path of transceiver architecture in accordance with various aspects described herein.

Referring to FIG. 4, illustrated is an embodiment of a cable assembly 400 comprising transceiver architecture of a transceiver device for encoding and communicating signals based on a concatenated leech lattice constellation with binary and non-binary codes. On the transmit path 310 of the transceiver device 306 at the cable assembly 400, for example, the FEC encoder 312 can operate to generate FEC codes and encode modulated signal points, (e.g., pulse amplitude modulated points of signals, or the like), in a constellation according to a concatenated Leech lattice with binary and non-binary codes. The transmit path 310 can operate multiple steps to define or select the points selected, which define a partition of the points in a twenty four dimensional space of a leech lattice configuration. Alternatively, the space can be a twelve two-dimensional space, for example.

The transmit path 310, for example, can comprise the FEC encoder 312, the transmit signal processing pipeline 314 and an FEC component 401. The transmit signal processing pipeline 314 can operate as a serial or parallel pipeline with one or more processors, and comprises a mapper component 402, a precoder component 404, and a filter component 406. The transceiver device 306 can further comprise the FEC component 401 that is coupled to the mapper component 402 of the transmit path 310. The mapper component 402 can receive encoded signals, sampled points, or FEC of communication signals from the FEC encoder 312 via transmission paths 410 with one or more most significant bits (msbs) and/or other modulation signal data (such as FEC and other sampled data points). The mapper 402 can process the received data into a constellation diagram having twenty four dimensional arrays of symbols (e.g., PAM4 symbols) and encode the data points according to a leech lattice so that the constellations generated are based on or generated according to a concatenated leech lattice. The mapper component 402 thus maps the coded signals based on concatenated leech lattice constellations with binary and non-binary codes.

The coded lattice modulation processes of the transmit path 310 can be based on leech lattices, for example, that can comprise a set of points in an n-dimensional real space, in which the coordinates of each point can be derived by one or more linear combinations of a predefined set of vectors. The coefficients of the one or more linear combinations can comprise integer numbers. Leech lattices can be an even unimodular lattice $\Lambda_{24}$ in 24-dimensional Euclidean space $E^{24}$, for example. A leech lattice can be unimodular, and thus, can be generated by the columns of a certain 24×24 matrix with a determinant of one. The leech lattice can be even, or, in other words, the square of the length of any vector in $\Lambda_{24}$ can be an even integer. In addition, the length of any non-zero vector in $\Lambda_{24}$ can be at least 2.

The precoder 404 can operate within the signaling pathway and can be in the form of a Tomlinson-Harashima pre-coder, for example. The precoder 404 can operate to perform transmit diversity and optimize the precoder with a receiver decoder at another transceiver device (not shown), which can be coupled to the communication links 320. Although the transceiver device 306 is illustrated with an encoding device, the transceiver can also include a decoder (not shown) also, which is further described infra.

The signal processing pipeline 314 can further comprise the filter 406 for providing a linear constraint on the communications. The filter 406 can operate to perform channel equalization by minimizing errors or noise within the communication as well as other optimization processes for signal transmission at high speeds of 100 Gbps or greater. The output of the linear filter 406 can further be utilized to drive a DAC 408 for signal conversion and/or a line-driver 408 for signal amplification, for example.

In another embodiment, the leech lattice generated can be concatenated with binary and non-binary codes. The mapper or mapping component 506 receives an output from the FEC component 401 (at the illustrated bottom pathway) that can operate to designate and communicate an FEC rate (e.g., one-half). The rate of the FEC coding (e.g., 32/64) can be one-half, for example, in which the rate can be the sum of the information symbol bits (e.g., 32) divided by the length of the code (e.g., 64). The mapper component 402 then operates to output a set of symbols to a DAC, such as twenty four symbols of the leech lattice of the constellation. The DAC 408 outputs via a channel 320.

On the transmit side of the transceiver 306 of the cable assembly 400, for example, the FEC encoder 312 operates for encoding bits to a leech lattice, and defining or selecting the points, which define a partition of the points in a 24 dimensional space, or a twelve two-dimensional space. In one embodiment, the transceivers discussed (e.g., transceiver 306) can encode and decode a code, such as a hexacode ($H_6$) that is defined over an alphabet of two bits. The symbol can have four different values, for example, which can be from a field denoted as $\{0, 1, \omega, \bar{\omega}\}$ If the multiple points being transported along a defined time are analyzed and the bits are analyzed that are encoded into the hexacode with a variable FEC, a larger coding gain can be obtained when re-encoding and decoding the receive points knowing the value of the hexacode used in the reconstruction of the transmission. A transmission of approximately three bits per Hertz (bits/Hz) can be achieved using a concatenated lattice constellation. The FEC encoder can add FEC code on top of the transmission that can thus allow extra protection to certain bits that enables an efficient decoding of the receive points.

In an example, two bits per symbol of the code can operate to specify the two most significant bits (msbs) of transmission paths 410, transmitted, for example, without coding. The other two bits, times 24 provides for 8 bits that are unencoded. Twenty-four bits can, for example, comprise the encoded bits. This allows in a path four constellation to transfer twenty-four bits of which there are six bits that are used to encode the hexacodes, and 18 bits remaining transmitted via a separate path that instructs how to construct the mathematics of the concatenated leech lattice constellation. In one example, $x=2^3 \text{ msb}_0 + 2^2 \text{ msb}_1 + \text{Lattice Points } (2 \text{ msb}_2 + \text{msb}_3)$, provides the points x for a lattice of 16 layers or a path 16 constellation. If considering a point to send across a channel from a digital analog converter 408, considering every point as part of the path 16 constellation, it can be written as the equation for x above. However, the lattice points (as $2 \text{ msb}_2 + \text{msb}_3$) illustrates that instead of sending every point between zero and three, only certain points or a subset of the points can be selected and transmitted that are between zero and three, for example. The transmission then amounts to sending twenty four symbols being transmitted over the channel.

Six bits can be provided via a lower pathway 412 into the mapper or mapping component 402 and can be set at a rate of the path for a certain redundancy, for example, at a rate of one-half code by the FEC component 401. A multi-level decoder of the lattice (leech lattice) can generate an estimate of the hexacode that was transmitted, in which the hexacode could have errors. The estimated hexacode can then be transmitted to an FEC decoder (not shown) that basically examines the input and corrects the errors. A remaining decoding of the hexacode decoding of the lattice is then further performed in a second or the same multi-level decoder of the leech lattice, in which the hexacode is assumed to be known, since the FEC block previous has corrected for error. The output of the second multi-level decoder can then be provided to the FEC decoding, which enables an improved Bit Error Rate (BER).

In another example or case, 64 bits could be transmitted, with 32 information symbols, with a minimum Hamming distance of 16. For example, a Reed Solomon code could be denoted RS (64, 32, 16) over GF (64) or Galois field of 64. Because the GF is 64 then the symbols of the Reed Solomon code can have the same size as the inputs of the hexacode. Each symbol of the RS code thus gets mapped to one symbol of the hexacode in this concatenation scheme involving a leech lattice with binary and non-binary codes. On the receiver side when the transmission reaches the FEC decoder, the hexacode of the leech lattice can be decoded to correct the errors, with the remainder of the leech lattice not being decoded. The remaining of the multi-level decoding of the leech lattice is then performed at the second or the same component in a loop of the multi-level decoding of the concatenated leech lattice, in which the hexacode is assumed to be known, as discussed above. In particular, the constellation scheme selects certain bits and encodes them using the FEC in the encoding scheme by using multi-level bits on the concatenated leech lattice.

Figure 5:
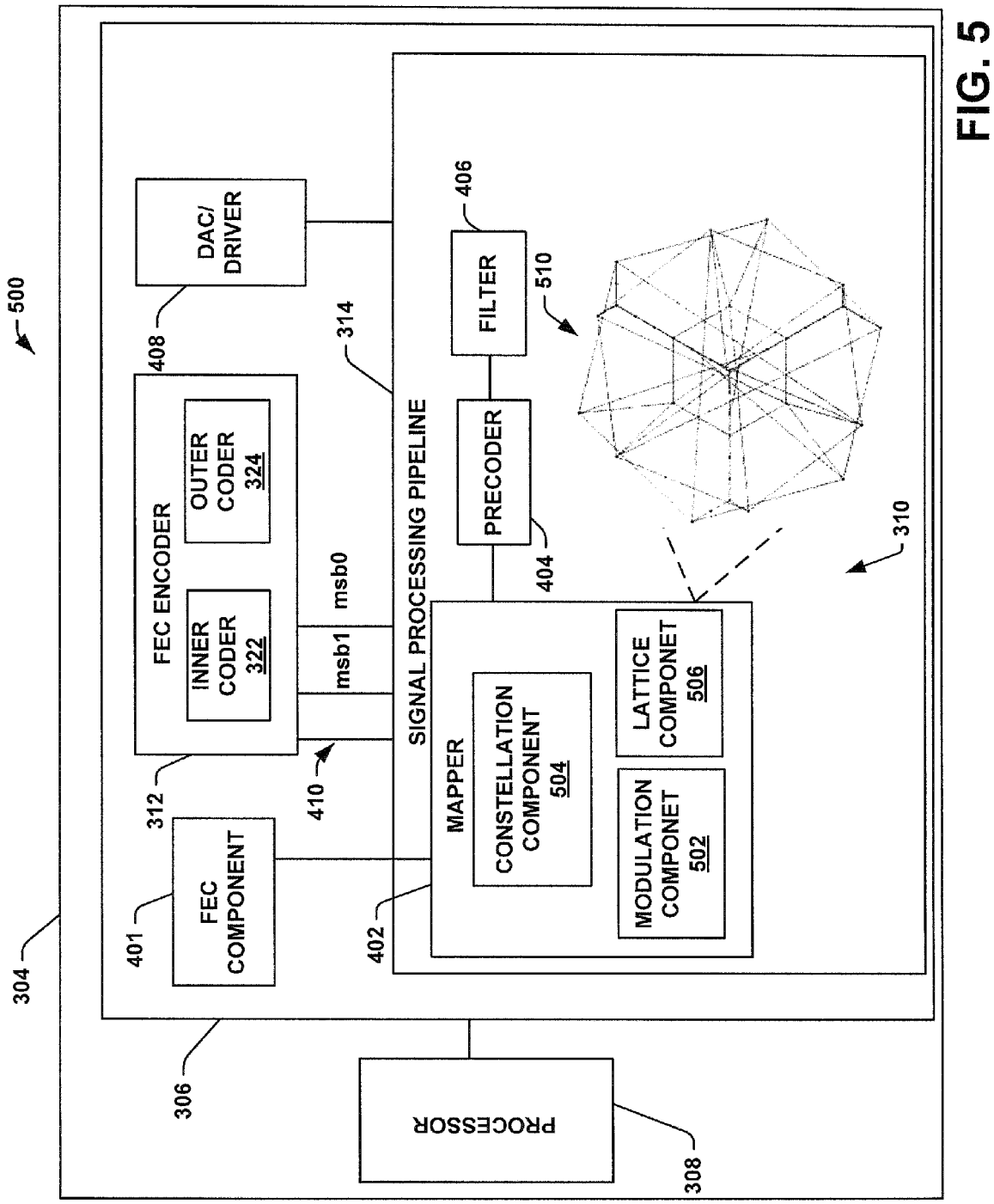
FIG. 5 is a block diagram illustrating another example of a cable assembly system with transmit path of transceiver architecture in accordance with various aspects described herein.

Referring now to FIG. 5, illustrated is an embodiment for processing high speed signals based on a concatenated leech lattice constellation with binary and non-binary codes to enable an increased coding gain. The transceiver 306 comprises similar elements and components as discussed above. The mapper component 402 further comprises a modulation component 502, a constellation component 504, and a lattice component 506 that operate to transmit communications based on constellations with a concatenated leech lattice for enabling a coding gain, which is a measure in the difference between the signal-to-noise ratio (SNR) levels between the uncoded system and coded system desired to reach the same bit error rate (BER) levels when used with the error correcting code (ECC), such as a forward error correcting code (FEC).

The modulation component 502 can be configured for generating modulated points with a number of bits at a time and mapping signal data to one or more levels (e.g., amplitude, etc.) in a concatenated leech lattice configuration with binary and non-binary codes. For example, the modulation component 502 can comprise a two bit modulator device that generates phase amplitude modulated points with two bits at a time and maps signal amplitudes to one of four amplitude levels, (e.g., −3 volts, −1 volt, 1 volt, and 3 volts, or other similar levels). Demodulation can thus be performed by detecting the amplitude levels of the carrier signal at each symbol period, for example, from the concatenation of codes that are mapped in a leech lattice constellation 510, for example.

The constellation component 504 is configured for constructing a constellation or constellation configuration of codes in a leech lattice by generating a dimensional vector of modulated points mapped to a leech lattice. The constellation component 504, for example, can receive an output from the modulation component 502 and generate a constellation of points to generate the constellation. For example, the constellation diagram can be a representation of modulated signals by a modulation scheme, and delineate a signal in a complex plane at symbol sampling instants. The constellation can diagram symbols that can be selected by a modulation scheme as a point in the complex plane, and used to recognize types of interference and distortion in a set of signals (a set being one or more), for example.

Upon reception of the signal, a decoder or demodulator (further described infra) either at a receiving transceiver device and/or at the transceiver device 306 can examine the received symbol, which may have been corrupted by the channel or the receiver (e.g. additive white Gaussian noise, distortion, phase noise or interference). The demodulator can operate to select, as its estimate of what was actually transmitted, that point on the constellation diagram which is closest (in a Euclidean distance sense, for example) to that of the received symbol. Thus, the demodulator could potentially demodulate incorrectly if the corruption has caused the received symbol to move closer to another constellation point than the one transmitted. The constellation can allow for a straightforward visualization or diagram of this process, in which the received symbol can be an arbitrary or selected point in the I-Q plane and then a transmitted symbol can be selected that is whichever constellation point is closest to it. For the purpose of analyzing a received signal quality, some types of corruption can be evident in the constellation diagram. For example, Gaussian noise can show as fuzzy constellation points. Non-coherent single frequency interference can show as circular constellation points. Phase noise shows as rotationally spreading constellation points. Attenuation can cause the corner points to move towards the center. A concatenated leech lattice constellation, such as the leech lattice constellation 510, can visualize phenomena similar to those an eye pattern does for one-dimensional signals. The eye pattern can be used, for example, to see timing jitter in one dimension of modulation.

The lattice component 506 can operate to embed points within the constellation according to a leech lattice by operating concurrently or in conjunction with the constellation diagram component 504. The lattice component 506 can translate the constellation based on a leech lattice to the set of signals, which are encoded communication data for transmission. The lattice component 506 can provide a restriction that the 24 dimensional vector(s) of modulated points (e.g., PAM4 points) to lie or conform to a concatenated leech lattice configuration with binary and non-binary codes, such as hexacodes, linear codes, Reed Solomon codes, trellis coded modulation codes, algebraic-geometric codes, hamming codes, other such codes and combinations of the same in a concatenated leech lattice constellation. The leech lattice constellation can be an even unimodular lattice $\Lambda_{24}$ in 24-dimensional Euclidean space $E^{24}$, for example, or an odd lattice. A leech lattice can be unimodular, and thus, can be generated by the columns of a certain 24×24 matrix with a determinant of one. The leech lattice can be even, or, in other words, the square of the length of any vector in $\Lambda_{24}$ can be an even integer. In addition, the length of any non-zero vector in $\Lambda_{24}$ can be at least 2. Cross-sections of the leech lattice are discussed herein, such as with reference to twelve and/or sixteen dimensions, or twelve/sixteen path constellation.

Figure 6:
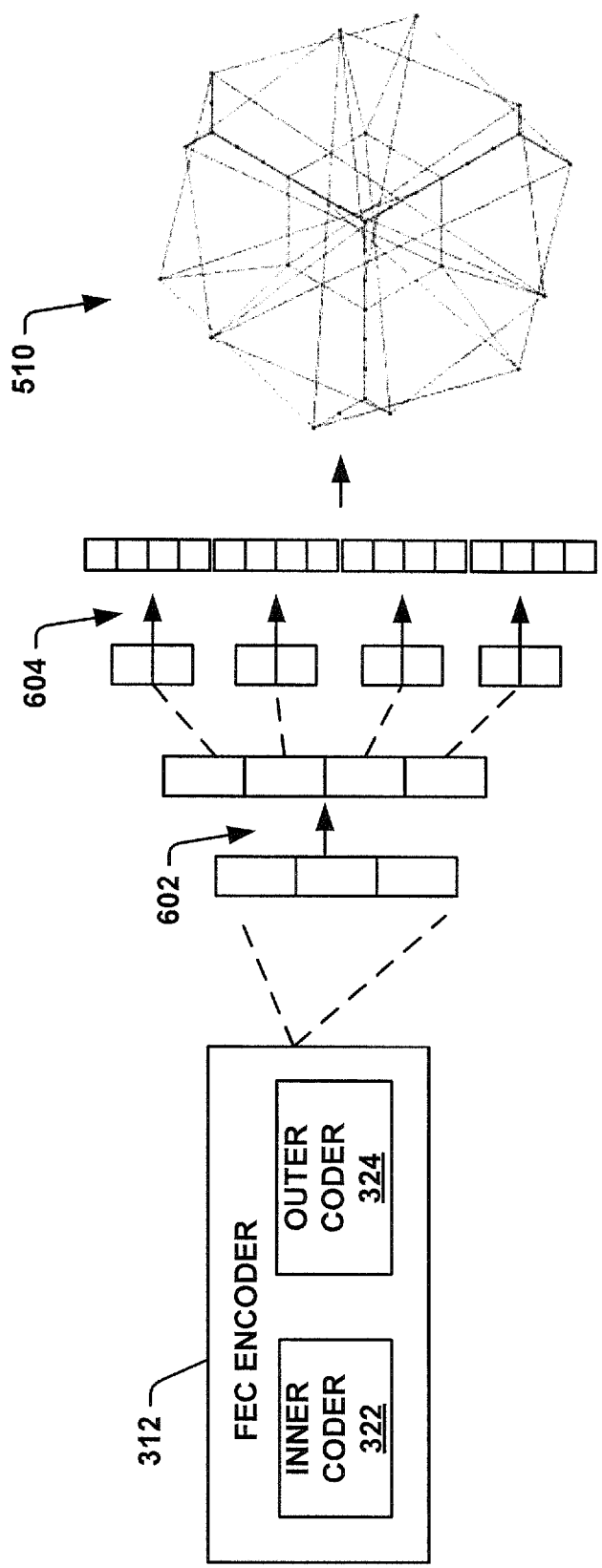
FIG. 6 is a block diagram illustrating an example of an FED decoder of a cable assembly system in accordance with various aspects described herein.

Referring to FIG. 6, illustrated is an aspect of the FEC encoder 312 for generating a concatenation of code in a concatenated leech lattice with binary and non-binary codes. The FEC encoder 312 comprises the inner coder 322 and the outer coder 324 as discussed above. The FEC encoder 312 can operate in the transceiver architectures described in this disclose generate 64 bits, for example that could be transmitted, with 32 information symbols, with a minimum Hamming distance of 16. For example, a Reed Solomon code 602 could be denoted RS (64, 32, 16) over GF (64) or Galois field of 64. Because the GF is 64 then the symbols of the Reed Solomon code 602 can have the same size as the inputs of a hexacode 604. Each symbol of the RS code 602 thus can get mapped to one symbol of the hexacode 604 in this concatenation scheme involving the leech lattice 510 with binary and non-binary codes, which is formed via the received concatenated codes at the mapper or mapping component 402.

The concatenated leech lattice, for example, can be formed from codes that are derived by combining an inner code and an outer code with binary and/or non-binary codes, as discussed above. A speed of three bits per Hertz is achieved through the twenty-four dimensions of the Leech Lattice, which results in 24 symbols that will be transmitted from the mapper or mapping component, for example. The three bits per Hertz computes to three times a product of a dimensional space (e.g., 24) for a number of bits to be transmitted (e.g., 72, 12 bits) that can be transmitted. The rate of the transmission is found by looking at sixteen layer constellations or a path 16 constellation.

Two bits per symbol of the code specify the two most significant bits (msbs) being transmitted, for example, to the mapper component 402 without coding. The other two bits, times 24 equals 8 bits that are uncoded, in which twenty-four bits are of the encoded bits. This allows in a path four constellation to transfer twenty-four bits of which there are six bits that are used to encode the Hexacodes, and 18 bits remaining transmitted via a separate path that instructs how to construct the mathematics of the concatenated leech lattice constellation. As discussed above, $x=2^3 \text{ msb}_0+2^{22} \text{ msb}_1+\text{Lattice Points}$ (2 $\text{msb}_2+\text{msb}_3$), provides the points x for a lattice of 16 layers or a path 16 constellation. If considering a point to send across a channel from the DAC, considering every point as part of the path 16 constellation, it can be written as the equation for x above. However, the lattice points (as 2 $\text{msb}_2+\text{msb}_3$) illustrates that instead of sending every point between zero and three, only certain points could be selected and transmitted (e.g., between zero and three). The transmission then amounts to sending 24 symbols being transmitted over the channel via the concatenated leech lattice 510.

Figure 7:
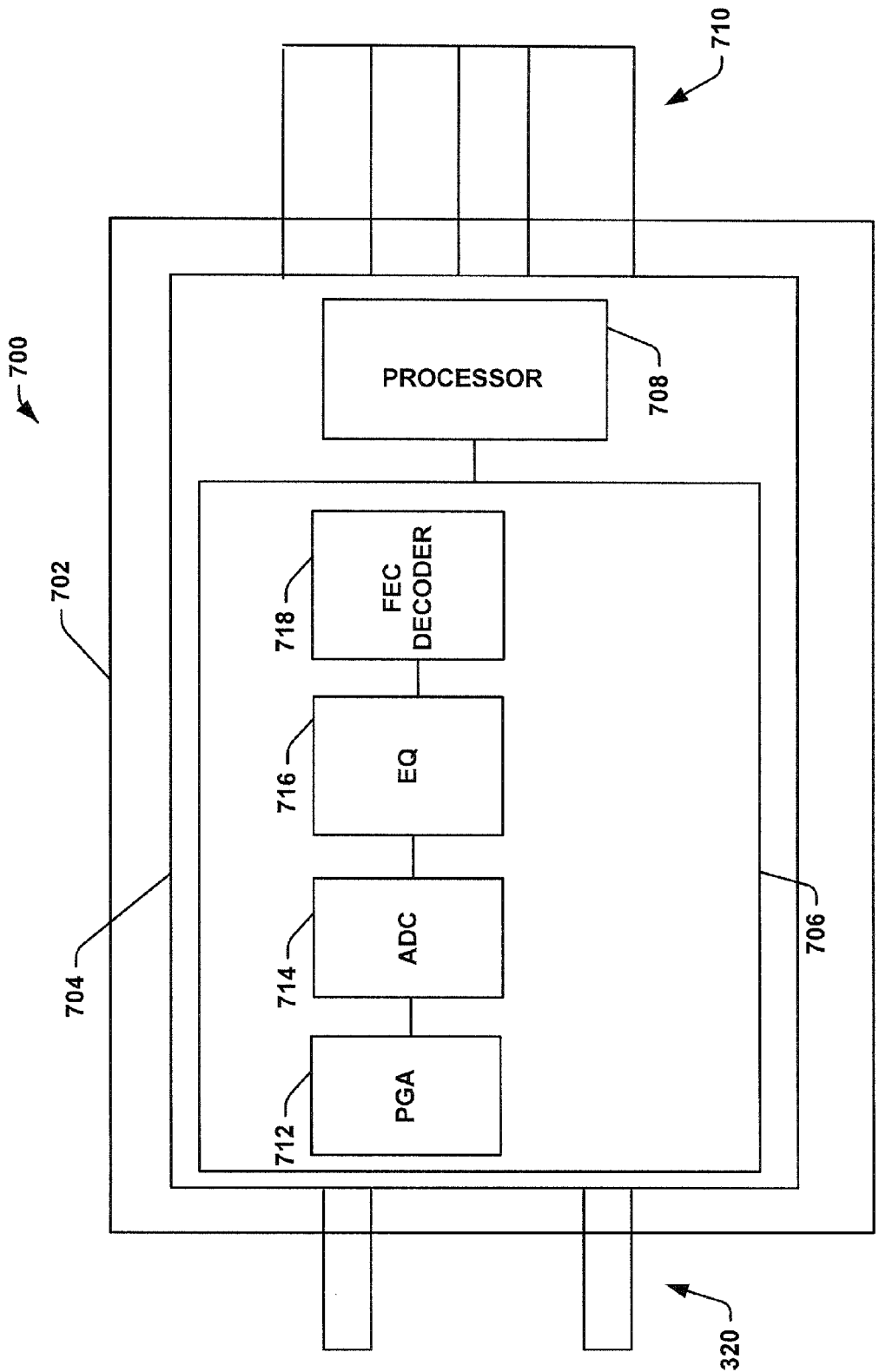
FIG. 7 is a block diagram illustrating an example of a receive path of transceiver architecture in accordance with various aspects described herein.

Referring now to FIG. 7, illustrated is an embodiment for processing high speed signals based on concatenated leech lattice constellations to enable a coding gain at a decoding stage. A cable assembly 700 comprises a plug assembly 302 having a mount, board, wafer package or processing device 704 that includes a transceiver device 706 and a processor 708. The plug assembly includes one or more interconnects 710 for coupling to another device for communications, such as a display, personal digital device, computing device or the like. The transceiver device 706 is illustrated with an architecture that can comprise elements and components of the transceiver 306, discussed above, and the transceiver 306 that likewise can further comprise the elements and components of the transceiver device 706. For example, the transceiver device 706 can comprise a programmable gain amplifier (PGA) 712, an analog-to-digital converter (ADC) 714, an equalizer component 716, and an FEC Decoder 718. The twinax pairs 320 communicate (transmit and receive) in a full-duplex mode of transmission as a communication link, for example, to and from the transceiver component 706. The signal can be amplified by the PGA 712, converted from analog to digital by the ADC 714, equalized by the equalizer 716 and further decoded by the FEC decoder 718 for 80 Gbps or 100 Gbps and greater transmissions based on leech lattice constellations or constellations having embedded leech lattice configurations.

On the receiver side when transmissions reach the FEC decoder 718, the hexacode of the concatenated leech lattice can be decoded to correct for any errors, with the remainder of the leech lattice not being decoded. The remaining of a multi-level decoding of the concatenated leech lattice can then be performed at a second or the same component (FEC decoder 718) in a loop of ta multi-level decoding of the concatenated leech lattice, in which the hexacode is assumed to be known, as discussed above. In particular, the constellation scheme selects certain bits and encodes them using the FEC in the encoding scheme by using multi-level bits on the concatenated leech lattice. Upon reception of the signal, the FEC decoder 718 can examine the received symbols, which may have been corrupted by the channel or the receiver (e.g. additive white Gaussian noise, distortion, phase noise or interference). The decoder can operate to decode forward error correction code and select, as its estimate of what was actually transmitted, that point on the concatenated leech lattice constellation that is closest (in a Euclidean distance sense, for example) to that of the received symbol. The decoder 718 could potentially demodulate incorrectly if the corruption has caused the received symbol to move closer to another constellation point than the one transmitted. The FEC decoder 718 can thus utilize the concatenated leech lattice constellation to enable for an analysis of the constellation of points in an embedded leech lattice configuration to achieve a maximum density of this process, in which the received symbol can be an arbitrary point in the I-Q plane and then a transmitted symbol can be selected that is at least one constellation point is closest to it, for example, with a maximum density and least amount of latency and highest spectral efficiency.

Figure 8:
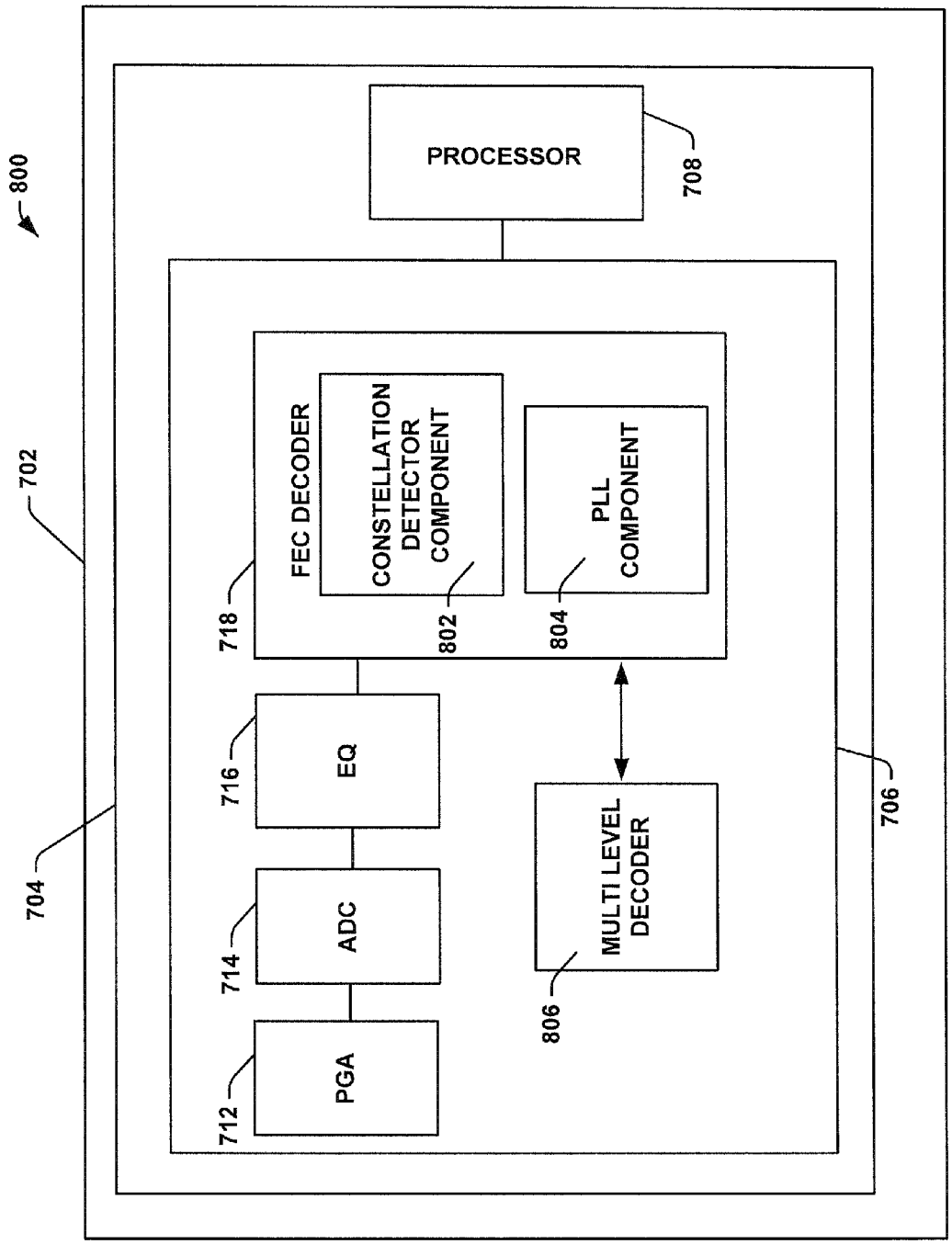
FIG. 8 is a block diagram illustrating another example of a receive path of transceiver architecture in accordance with various aspects described herein.

Referring now to FIG. 8, illustrated is a transceiver architecture for increasing a coding gain based on decoding with constellations constructed with a concatenated leech lattice having binary and non-binary codes. The cable assembly 700 comprises similar components as discussed above with regard to FIG. 7. On the receive pathway of the cable assembly 800, an input signal is received by an analog front end that comprises the programmable gain amplifier 712 and the analog to digital converter (ADC) 714. The receive path can further comprise a digital receive path that comprises the linear equalizer 716 followed by the FEC decoder 718.

The FEC decoder 718 can comprise a constellation detection component 802 where detector algorithms can be processed to reduce the error rate in detecting the transmitted constellation points based on the concatenated leech lattice constellations. Additionally or alternatively, a phase locked loop component (PLL) 804 can be configured for the purpose of generating the clock recovery from a clock component (not shown). The PLL component 804 can be configured to operate phase detection for detecting the timing differential between the receive signal and the detected signal, which can be utilized to drive a clock recovery loop, for example. In addition or alternatively, the PLL component 802 can utilize the signals derived from the constellation detector component 802 to detect a timing differential with the receive signal, or alternatively, by slicing the output of the linear equalizer 604 and utilizing the output signal as the detected signal. The output of the constellation detector 702 can then be applied to the decoder 718 for further controlling errors in data transmission and maintaining a low latency with high spectral efficiency in the communications received and transmitted.

In another embodiment, the transceiver 706 comprises a multi level decoder 806. The multi-level decoder 806 of the lattice (Leech Lattice) creates an estimate of the hexacode that was transmitted. This hexacode could have errors. The estimated hexacode is transmitted to an FEC decoder 610 that basically examines the input and corrects the errors. A remaining decoding of the Hexacode decoding of the lattice is then further performed in a second or the same multi level Decoder 608 of the leech lattice, in which the Hexacode is assumed to be known, since the FEC decoder 718 component previously corrected for error. The output of the second Multi-level decoder or loop to the same multi level decoder 806 is then provided to the FEC decoding, which enables an improved Bit Error Rate (BER).

In another example of an embodiment, 64 bits could be transmitted, with 32 information symbols, with a minimum Hamming distance of 16. For example, a Reed Solomon code could be designated RS (64, 32, 16) over Galois Field (GF) (64) or, in other expression, a Galois Field of 64. Because GF is 64, then the symbols of the Reed Solomon code have an approximately same size as the inputs of the Hexacode. Each symbol of the RS code thus gets mapped to one symbol of the Hexacode in this concatenation scheme. On the receiver side (e.g., the plug assembly 218) when the transmission reaches the FEC decoder 708, the hexacode of the concatenated leech lattice is decoded at the FEC decoder 708 to correct the errors that can occur from an initial analysis from the multi level decoder 806 of the data received at the equalizer 716, with the remainder of the leech lattice not being decoded. The remaining of the multi-level decoding of the leech lattice is then performed at a second multilevel decoder or the same multi level decoder 806 in a loop with the FEC decoder 718, in which the hexacode is assumed to be known after an initial estimation at 806 and further correction of code at 718. In particular, the constellation scheme selects certain bits and encodes them using the FEC in the encoding scheme by using multi-level bits on the concatenated leech lattice having binary and non-binary codes.

Example Methods of Full Duplex Transmission Over Reduced Pairs of Twinax Cables

While the methods or process flows described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
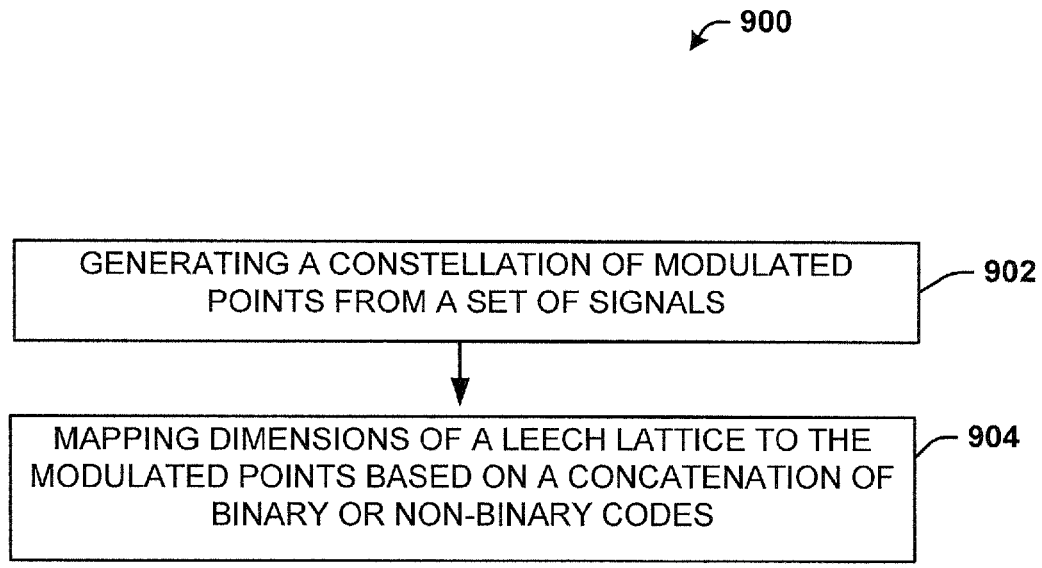
FIG. 9 illustrates an example of a flow diagram of a receive path of transceiver architecture in accordance with various aspects described herein.

An example method 900 for a cable assembly to transmit and receive communication data at high speed transmissions based on a concatenated leech lattice constellation is illustrated in FIG. 9. At 902, the method 900 comprises generating, by a device with a processor, a constellation of modulated points from a set of signals received.

At 904, dimensions of a leech lattice are mapped to the modulated points to generate the leech lattice with the modulated points in the constellation based on a concatenation of binary or non-binary codes.

The method can further comprise generating a set of forward error correction codes to encode a subset of bits with the set of forward error correction codes and multi-level bits on the leech lattice. In one embodiment, a reed solomon code can be mapped to a set (one or more) of symbols of a hexacode for a concatenation of the binary and the non-binary codes into the leech lattice of the constellation.

At a receiving component of a transceiver of the cable assembly, the method can comprise decoding a hexacode of the leech lattice from a received transmission with a multi-level decoder, and generating an estimate of the hexacode to a forward error correction code decoder to correct for errors detected. A remainder of unencoded data (e.g., bits/symbols) can then be decoded by a different multi level decoder component or fed back into the same multi level decoder component for decoding operations. The FEC decoder can then further process any additional FEC to analyze and fix for any transmission errors. In other words, the decoding operations can comprise decoding a subset of the leech lattice comprising a hexacode at the FEC decoder, and decoding a remainder of the leech lattice at the multi-level decoder. For example, an estimate of a subset of the leech lattice constellation can be generated by a multi level decoder and processed for errors at the FEC decoder. Subsequently, the remainder of the leech lattice can be processed via another/same multi-level decoder and then an FEC decoder.

In one embodiment, the method 900 comprises selecting a subset of bits from a multi-level set of bits on the leech lattice. The subset of bits can be selected randomly or based on a predetermined function, which can include a cross section of dimensions of the leech lattice, for example. The subset of bits can encoded with a forward error correction code. A set of twenty four symbols can then be transmitted over a channel, such as via a communication link with a high speed communication of 100 Gbps or greater.

Figure 10:
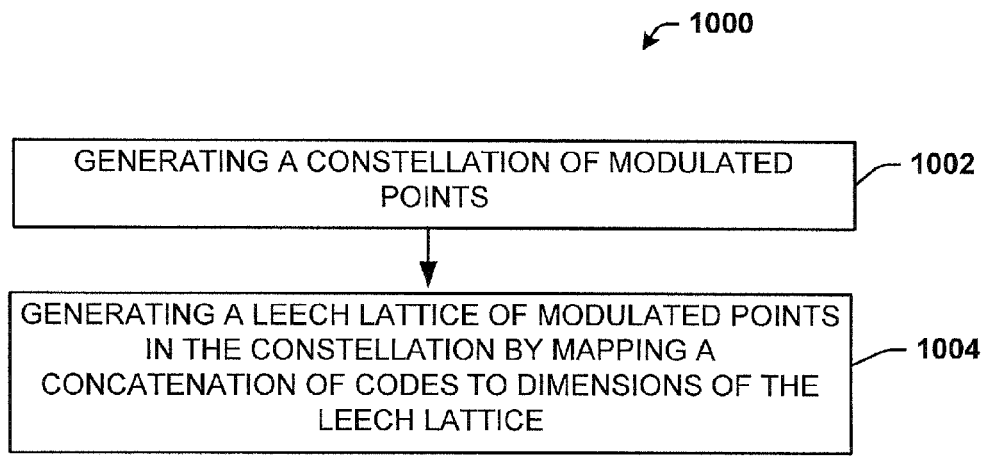
FIG. 10 illustrates an example of a flow diagram for a cable assembly system in accordance with various aspects described herein.

Referring now to FIG. 10, illustrated is a method 1000 for a transceiver of a cable assembly operable to communicate data at high speeds with high spectral efficiency based on a concatenated leech lattice with binary and non-binary codes. At 1002, a constellation component is configured for generating a constellation of modulated points. At 1004, a lattice component is configured for generating a leech lattice of the modulated points in the constellation by mapping a concatenation of codes to dimensions of the leech lattice. Additionally or alternatively, the leech lattice component is further configured for mapping a concatenation of non-binary codes and the binary codes to the dimensions of the leech lattice.

In another embodiment, an encoder component is configured for selecting a subset of bits from a multi-level set of bits on the leech lattice and encoding the subset of bits with a forward error correction code for transmission. The encoder component is also configured for encoding bits of the binary code in a hexacode with a variable forward error correction code. Further, a forward error correction encoder component is configured for generating a variable forward error correction code to be encoded into a hexacode with a subset of bits to the leech lattice for a transmission. A transmission component is configured for transmitting approximately three bits per Hertz by utilizing twenty four dimensions of the leech lattice of the constellation to communicate twenty four symbols.

Example Computing Environment

Figure 11:
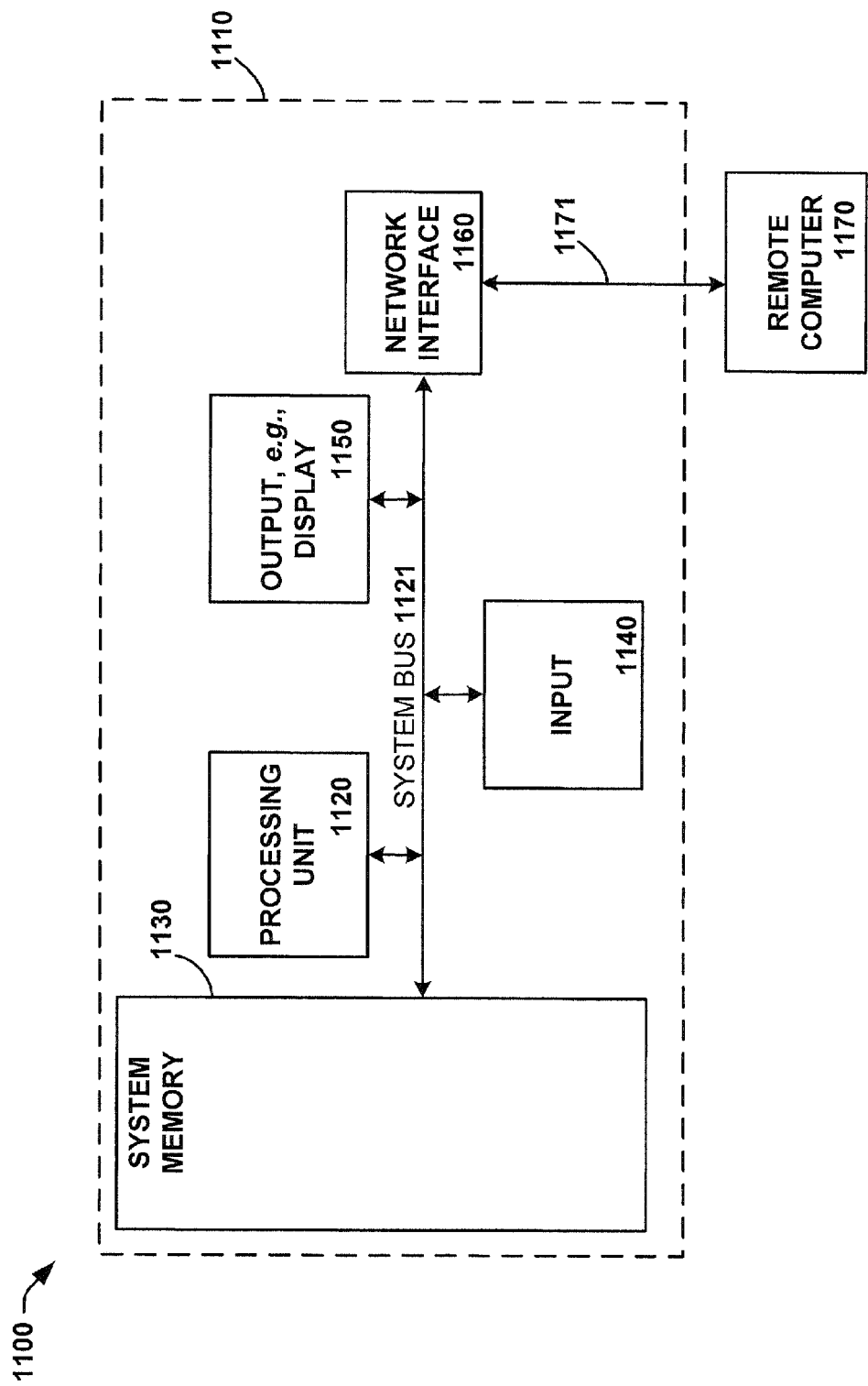
FIG. 11 illustrates a block diagram of an example electronic computing environment that can be implemented in conjunction with one or more aspects described herein.

As mentioned, advantageously, the techniques described herein can be applied to any device and/or network where power management is desirable in a multiprocessor system. It is to be understood, therefore, that handheld, portable and other computing devices and computing objects of all kinds are contemplated for use in connection with the various non-limiting embodiments, i.e., anywhere that a device may wish to implement power management for a multiprocessor system. Accordingly, the below general purpose remote computer described below in FIG. 11 is but one example, and the disclosed subject matter can be implemented with any client having network/bus interoperability and interaction. Thus, the disclosed subject matter can be implemented in an environment of networked hosted services in which very little or minimal client resources are implicated, e.g., a networked environment in which the client device serves merely as an interface to the network/bus, such as an object placed in an appliance.

Although not required, some aspects of the disclosed subject matter can partly be implemented via an operating system, for use by a developer of services for a device or object, and/or included within application software that operates in connection with the component(s) of the disclosed subject matter. Software may be described in the general context of computer executable instructions, such as program modules or components, being executed by one or more computer(s), such as projection display devices, viewing devices, or other devices. Those skilled in the art will appreciate that the disclosed subject matter may be practiced with other computer system configurations and protocols.

FIG. 11 thus illustrates an example of a suitable computing system environment 1100 in which some aspects of the disclosed subject matter can be implemented, although as made clear above, the computing system environment 1100 is only one example of a suitable computing environment for a device and is not intended to suggest any limitation as to the scope of use or functionality of the disclosed subject matter. Neither should the computing environment 1100 be interpreted as having any dependency or requirement relating to any one or combination of components illustrated in the exemplary operating environment 1300.

With reference to FIG. 11, an exemplary device for implementing the disclosed subject matter includes a general-purpose computing device in the form of a computer 1110. Components of computer 1110 may include, but are not limited to, a processing unit 1120, a system memory 1130, and a system bus 1121 that couples various system components including the system memory to the processing unit 1120. The system bus 1121 may be any of several types of bus structures including a memory bus or memory controller, a peripheral bus, and a local bus using any of a variety of bus architectures.

Computer 1110 typically includes a variety of computer readable media. Computer readable media can be any available media that can be accessed by computer 1110. By way of example, and not limitation, computer readable media can comprise computer storage media and communication media. Computer storage media includes volatile and nonvolatile, removable and non-removable media implemented in any method or technology for storage of information such as computer readable instructions, data structures, program modules or other data. Computer storage media includes, but is not limited to, RAM, ROM, EEPROM, flash memory or other memory technology, CDROM, digital versatile disks (DVD) or other optical disk storage, magnetic cassettes, magnetic tape, magnetic disk storage or other magnetic storage devices, or any other medium which can be used to store the desired information and which can be accessed by computer 1110. Communication media typically embodies computer readable instructions, data structures, program modules, or other data in a modulated data signal such as a carrier wave or other transport mechanism and includes any information delivery media.

The system memory 1130 may include computer storage media in the form of volatile and/or nonvolatile memory such as read only memory (ROM) and/or random access memory (RAM). A basic input/output system (BIOS), containing the basic routines that help to transfer information between elements within computer 1110, such as during start-up, may be stored in memory 1130. Memory 1130 typically also contains data and/or program modules that are immediately accessible to and/or presently being operated on by processing unit 1120. By way of example, and not limitation, memory 1130 may also include an operating system, application programs, other program modules, and program data.

The computer 1110 may also include other removable/non-removable, volatile/nonvolatile computer storage media. For example, computer 1110 could include a hard disk drive that reads from or writes to non-removable, nonvolatile magnetic media, a magnetic disk drive that reads from or writes to a removable, nonvolatile magnetic disk, and/or an optical disk drive that reads from or writes to a removable, nonvolatile optical disk, such as a CD-ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. A hard disk drive is typically connected to the system bus 1121 through a non-removable memory interface such as an interface, and a magnetic disk drive or optical disk drive is typically connected to the system bus 1121 by a removable memory interface, such as an interface.

A user can enter commands and information into the computer 1110 through input devices such as a keyboard and pointing device, commonly referred to as a mouse, trackball, or touch pad. Other input devices can include a microphone, joystick, game pad, satellite dish, scanner, wireless device keypad, voice commands, or the like. These and other input devices are often connected to the processing unit 1120 through user input 1140 and associated interface(s) that are coupled to the system bus 1121, but may be connected by other interface and bus structures, such as a parallel port, game port, or a universal serial bus (USB). A graphics subsystem can also be connected to the system bus 1121. A projection unit in a projection display device, or a HUD in a viewing device or other type of display device can also be connected to the system bus 1121 via an interface, such as output interface 1150, which may in turn communicate with video memory. In addition to a monitor, computers can also include other peripheral output devices such as speakers which can be connected through output interface 1150.

The computer 1110 can operate in a networked or distributed environment using logical connections to one or more other remote computer(s), such as remote computer 1170, which can in turn have media capabilities different from device 1110. The remote computer 1170 can be a personal computer, a server, a router, a network PC, a peer device, personal digital assistant (PDA), cell phone, handheld computing device, a projection display device, a viewing device, or other common network node, or any other remote media consumption or transmission device, and may include any or all of the elements described above relative to the computer 1110. The logical connections depicted in FIG. 11 include a network 1171, such local area network (LAN) or a wide area network (WAN), but can also include other networks/buses, either wired or wireless. Such networking environments are commonplace in homes, offices, enterprise-wide computer networks, intranets and the Internet.

When used in a LAN networking environment, the computer 1110 can be connected to the LAN 1171 through a network interface or adapter. When used in a WAN networking environment, the computer 1110 can typically include a communications component, such as a modem, or other means for establishing communications over the WAN, such as the Internet. A communications component, such as wireless communications component, a modem and so on, which can be internal or external, can be connected to the system bus 1121 via the user input interface of input 1140, or other appropriate mechanism. In a networked environment, program modules depicted relative to the computer 1110, or portions thereof, can be stored in a remote memory storage device. It will be appreciated that the network connections shown and described are exemplary and other means of establishing a communications link between the computers can be used.

Example Networking Environment

Figure 12:
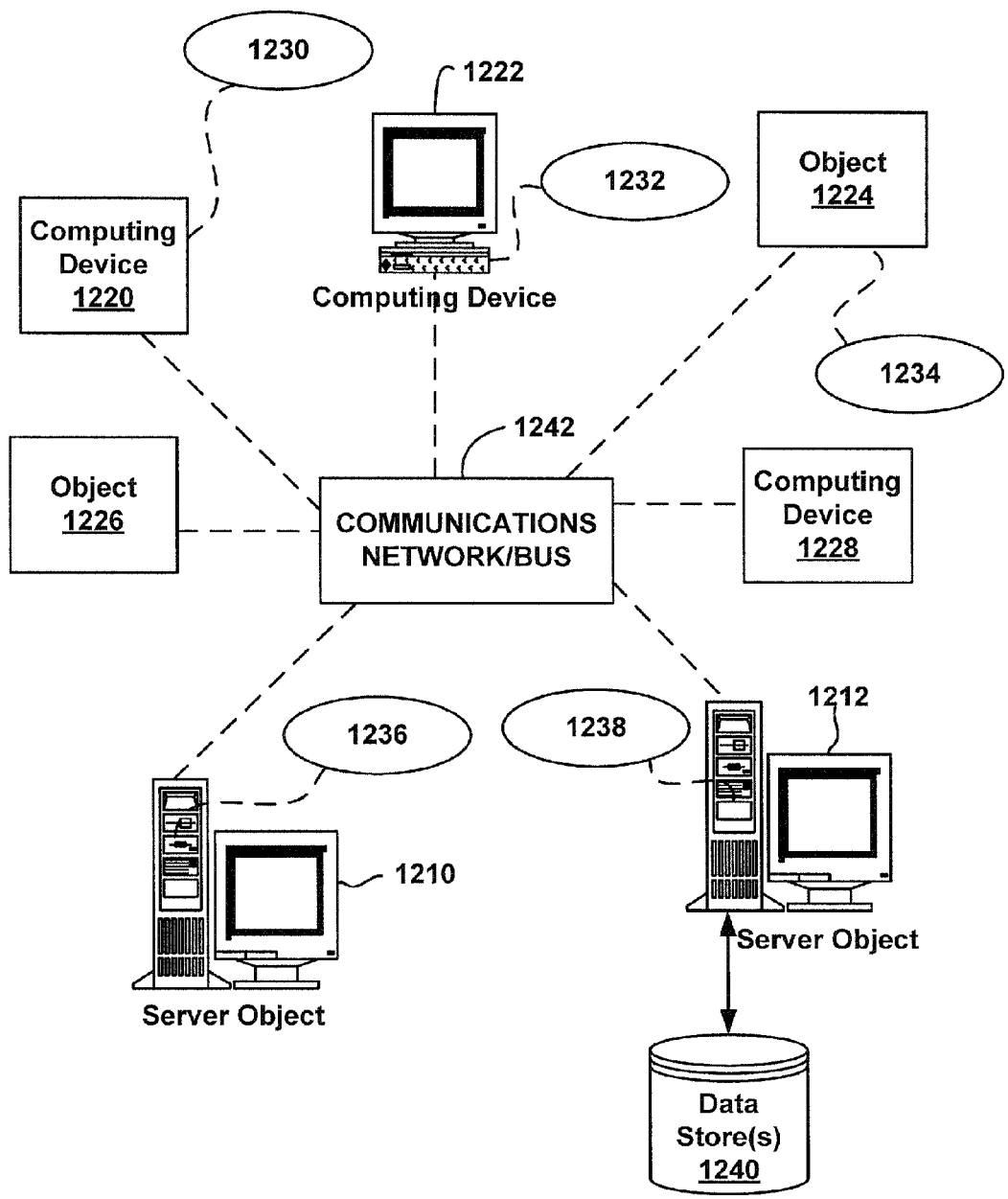
FIG. 12 illustrates a block diagram of an example data communication network that can be operable in conjunction with various aspects described herein.

FIG. 12 provides a schematic diagram of an exemplary networked or distributed computing environment. The distributed computing environment comprises computing objects 1210, 1212, etc. and computing objects or devices 1220, 1222, 1224, 1226, 1228, etc., which may include programs, methods, data stores, programmable logic, etc., as represented by applications 1230, 1232, 1234, 1236, 1238 and data store(s) 1240. It can be appreciated that computing objects 1210, 1212, etc. and computing objects or devices 1220, 1222, 1224, 1226, 1228, etc. may comprise different devices, including a multimedia display device or similar devices depicted within the illustrations, or other devices such as a mobile phone, personal digital assistant (PDA), audio/video device, MP3 players, personal computer, laptop, etc. It should be further appreciated that data store(s) 1240 can include one or more cache memories, one or more registers, or other similar data stores disclosed herein.

Each computing object 1210, 1212, etc. and computing objects or devices 1220, 1222, 1224, 1226, 1228, etc. can communicate with one or more other computing objects 1210, 1212, etc. and computing objects or devices 1220, 1222, 1224, 1226, 1228, etc. by way of the communications network 1242, either directly or indirectly. Even though illustrated as a single element in FIG. 12, communications network 1242 may comprise other computing objects and computing devices that provide services to the system of FIG. 12, and/or may represent multiple interconnected networks, which are not shown. Each computing object 1210, 1212, etc. or computing object or devices 1220, 1222, 1224, 1226, 1228, etc. can also contain an application, such as applications 1230, 1232, 1234, 1236, 1238, that might make use of an API, or other object, software, firmware and/or hardware, suitable for communication with or implementation of the techniques and disclosure described herein.

There are a variety of systems, components, and network configurations that support distributed computing environments. For example, computing systems can be connected together by wired or wireless systems, by local networks or widely distributed networks. Currently, many networks are coupled to the Internet, which provides an infrastructure for widely distributed computing and encompasses many different networks, though any network infrastructure can be used for exemplary communications made incident to the systems automatic diagnostic data collection as described in various embodiments herein.

Thus, a host of network topologies and network infrastructures, such as client/server, peer-to-peer, or hybrid architectures, can be utilized. The "client" is a member of a class or group that uses the services of another class or group to which it is not related. A client can be a process, i.e., roughly a set of instructions or tasks, that requests a service provided by another program or process. The client process utilizes the requested service, in some cases without having to "know" any working details about the other program or the service itself.

In a client/server architecture, particularly a networked system, a client is usually a computer that accesses shared network resources provided by another computer, e.g., a server. In the illustration of FIG. 12, as a non-limiting example, computing objects or devices 1220, 1222, 1224, 1226, 1228, etc. can be thought of as clients and computing objects 1210, 1212, etc. can be thought of as servers where computing objects 1210, 1212, etc., acting as servers provide data services, such as receiving data from client computing objects or devices 1220, 1222, 1224, 1226, 1228, etc., storing of data, processing of data, transmitting data to client computing objects or devices 1220, 1222, 1224, 1226, 1228, etc., although any computer can be considered a client, a server, or both, depending on the circumstances.

A server is typically a remote computer system accessible over a remote or local network, such as the Internet or wireless network infrastructures. The client process may be active in a first computer system, and the server process may be active in a second computer system, communicating with one another over a communications medium, thus providing distributed functionality and allowing multiple clients to take advantage of the information-gathering capabilities of the server. Any software objects utilized pursuant to the techniques described herein can be provided standalone, or distributed across multiple computing devices or objects.

In a network environment in which the communications network 1242 or bus is the Internet, for example, the computing objects 1210, 1212, etc. can be Web servers with which other computing objects or devices 1220, 1222, 1224, 1226, 1228, etc. communicate via any of a number of known protocols, such as the hypertext transfer protocol (HTTP). Computing objects 1210, 1212, etc. acting as servers may also serve as clients, e.g., computing objects or devices 1220, 1222, 1224, 1226, 1228, etc., as may be characteristic of a distributed computing environment.

Reference throughout this specification to "one embodiment," "an embodiment," "an example", "a disclosed aspect," or "an aspect" means that a particular feature, structure, or characteristic described in connection with the embodiment or aspect is included in at least one embodiment or aspect of the present disclosure. Thus, the appearances of the phrase "in one embodiment," "in one example," "in one aspect," or "in an embodiment," in various places throughout this specification are not necessarily all referring to the same embodiment. Furthermore, the particular features, structures, or characteristics may be combined in any suitable manner in various disclosed embodiments.

As utilized herein, terms "component," "system," "architecture," "engine" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, calculating, determining, or displaying, and the like, refer to the action and processes of processing systems, and/or similar consumer or industrial electronic devices or machines, that manipulate or transform data represented as physical (electrical and/or electronic) quantities within the registers or memories of the electronic device(s), into other data similarly represented as physical quantities within the machine and/or computer system memories or registers or other such information storage, transmission and/or display devices.

Unless otherwise indicated, all numbers, values and/or expressions referring to characteristics (e.g. speed) used in the specification and claims are to be understood as modified in all instances by the term "about."

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A cable assembly, comprising:
   a transceiver device configured for communicating a plurality of signals via a communication link, and comprising a memory storing executable instructions; and
   a processor, communicatively coupled to the memory, that facilitates execution of the executable components, comprising:
      a constellation component configure for generating a constellation of modulated points from a plurality of signals received; and
      a lattice component configured for generating a leech lattice within the constellation of modulated points by mapping dimensions of the leech lattice to the modulated points, the leech lattice comprising a concatenation of codes.

2. The cable assembly of claim 1, wherein the lattice component is further configured for mapping the modulated points to twenty four dimensions of the leech lattice in the constellation.

3. The cable assembly of claim 1, further comprising a forward error correction encoder that generates a plurality of forward error correction codes based on the plurality of signals and generates an output to the constellation component.

4. The cable assembly of claim 1, wherein the codes are at least one of binary or non-binary codes.

5. The cable assembly of claim 1, further comprising a digital to analog converter component configured for receiving a set of twenty four symbols from the constellation component and communicating a digital signal based on the set of twenty four symbols to a decoder configured for decoding the set of twenty four symbols according to the leech lattice of the constellation.

6. The cable assembly of claim 1, wherein further comprising a decoder component configured for decoding a plurality of hexacodes received that are encoded based on the concatenation of the codes of the leech lattice.

7. The cable assembly of claim 1, further comprising a forward error correction code rate component configured for setting a symbol rate to the constellation component for processing the constellations of modulated points into a set of twenty four symbols.

8. The signal processing system of claim 1, wherein the leech lattice component is further configured for defining a partition of the modulated points in a twenty four dimensional space to enable an encoding of the bits to the leech lattice.

9. A transceiver device comprising:
a memory configured to store computer-executable instructions; and
a processor, coupled to the memory, configured to facilitate execution of computer-executable instructions to perform operations, the operations comprising:
generating a constellation of modulated points; and
generating a leech lattice of the modulated points in the constellation by mapping a concatenation of codes to dimensions of the leech lattice.

10. The transceiver device of claim 9, wherein the operations further comprise:
mapping a concatenation of at least one of non-binary codes or binary codes to the dimensions of the leech lattice.

11. The transceiver device of claim 9, wherein the operations further comprise:
selecting a subset of bits from a multi-level plurality of bits on the leech lattice and encoding the subset of bits with a forward error correction code for transmission.

12. The transceiver device of claim 9, wherein the operations further comprise:
generating a variable forward error correction code to be encoded into a hexacode with a subset of bits to the leech lattice for a transmission.

13. The transceiver device of claim 9, wherein the operations further comprise:
encoding bits of the binary code in a hexacode with a variable forward error correction code.

14. The transceiver device of claim 9, wherein the operations further comprise:
transmitting approximately three bits per Hertz by utilizing twenty four dimensions of the leech lattice of the constellation to communicate twenty four symbols.

15. A signal processing method, comprising:
generating, by a device with a processor, a constellation of modulated points from a plurality of signals received; and
mapping dimensions of a leech lattice to the modulated points to generate the leech lattice with the modulated points in the constellation based on a concatenation of binary or non-binary codes.

16. The signal processing method of claim 15, further comprising:
generating a plurality of forward error correction codes to encode a subset of bits with the plurality of forward error correction codes and multi-level bits on the leech lattice.

17. The signal processing method of claim 15, further comprising:
mapping a reed solomon code to a plurality of symbols of a hexacode for the concatenation of the binary and the non-binary codes into the leech lattice of the constellation.

18. The signal processing method of claim 15, further comprising:
decoding a hexacode of the leech lattice from a received transmission with a multi-level decoder; and
communicating an estimate of the hexacode to a forward error correction code decoder to correct for errors detected.

19. The signal processing method of claim 18, further comprising:
decoding a subset of the leech lattice comprising a hexacode at the forward error correction decoder; and
decoding a remainder of the leech lattice at the multi-level decoder.

20. The signal processing method of claim 18, further comprising:
selecting a subset of bits from a multi-level plurality of bits on the leech lattice;
encoding the subset of bits with a forward error correction code; and
transmitting a set of twenty four symbols over a channel.

* * * * *